(12) United States Patent
Yang et al.

(10) Patent No.: US 11,244,856 B2
(45) Date of Patent: Feb. 8, 2022

(54) METHOD AND EQUIPMENT FOR FORMING GAPS IN A MATERIAL LAYER

(71) Applicant: TAIWAN SEMICONDUCTOR MANUFACTURING CO., LTD., Hsinchu (TW)

(72) Inventors: Chan-Syun David Yang, Taipei (TW); Li-Te Lin, Hsinchu (TW); Yu-Ming Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/843,185

(22) Filed: Dec. 15, 2017

(65) Prior Publication Data

US 2019/0096739 A1 Mar. 28, 2019

Related U.S. Application Data

(60) Provisional application No. 62/564,906, filed on Sep. 28, 2017.

(51) Int. Cl.
*H01L 21/311* (2006.01)
*H01L 21/768* (2006.01)
*H01L 21/67* (2006.01)
*H01L 21/683* (2006.01)

(52) U.S. Cl.
CPC .... *H01L 21/7682* (2013.01); *H01L 21/31111* (2013.01); *H01L 21/31116* (2013.01); *H01L 21/31144* (2013.01); *H01L 21/67069* (2013.01); *H01L 21/76816* (2013.01); *H01L 21/6831* (2013.01)

(58) Field of Classification Search
CPC .......... H01L 21/7682; H01L 21/31116; H01L 21/76816
See application file for complete search history.

(56) References Cited

U.S. PATENT DOCUMENTS

2016/0064239 A1* 3/2016 Shih ................... H01L 21/0273
438/694
2018/0123029 A1* 5/2018 Park ..................... H01L 27/222

* cited by examiner

*Primary Examiner* — Thomas T Pham
(74) *Attorney, Agent, or Firm* — Maschoff Brennan

(57) ABSTRACT

A method and equipment for forming gaps in a material layer are provided. The equipment includes a supporter and an etching device. The supporter is configured to support a semiconductor device. In the method for forming gaps in a material layer, at first, the semiconductor device is provided. Then, a material layer of the semiconductor device is etched to form vertical gaps in the material layer. Thereafter, the vertical sidewall of each of the vertical gaps is etched in accordance with a predetermined gap profile by using directional charged particle beams. The directional charged particle beams are provided by the etching device, and each of the directional charged particle beams has two energy peaks.

20 Claims, 33 Drawing Sheets

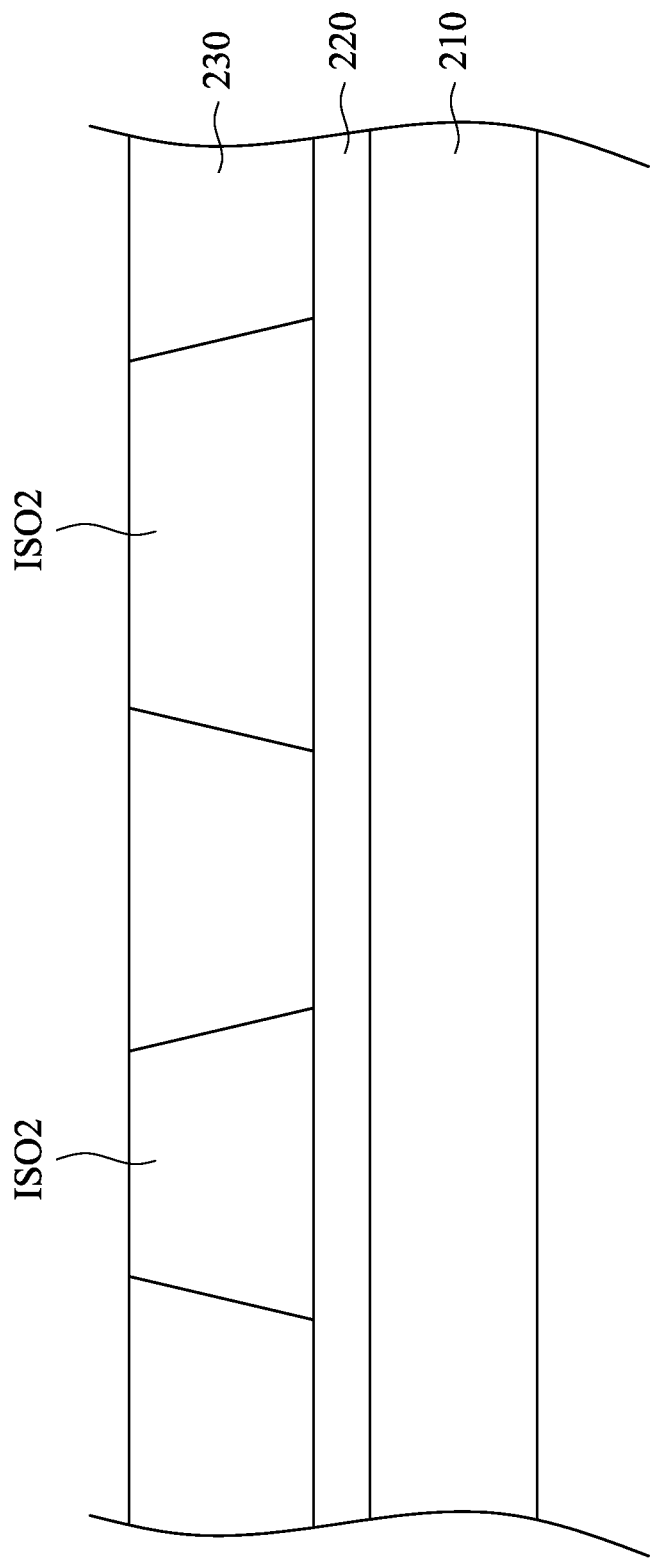

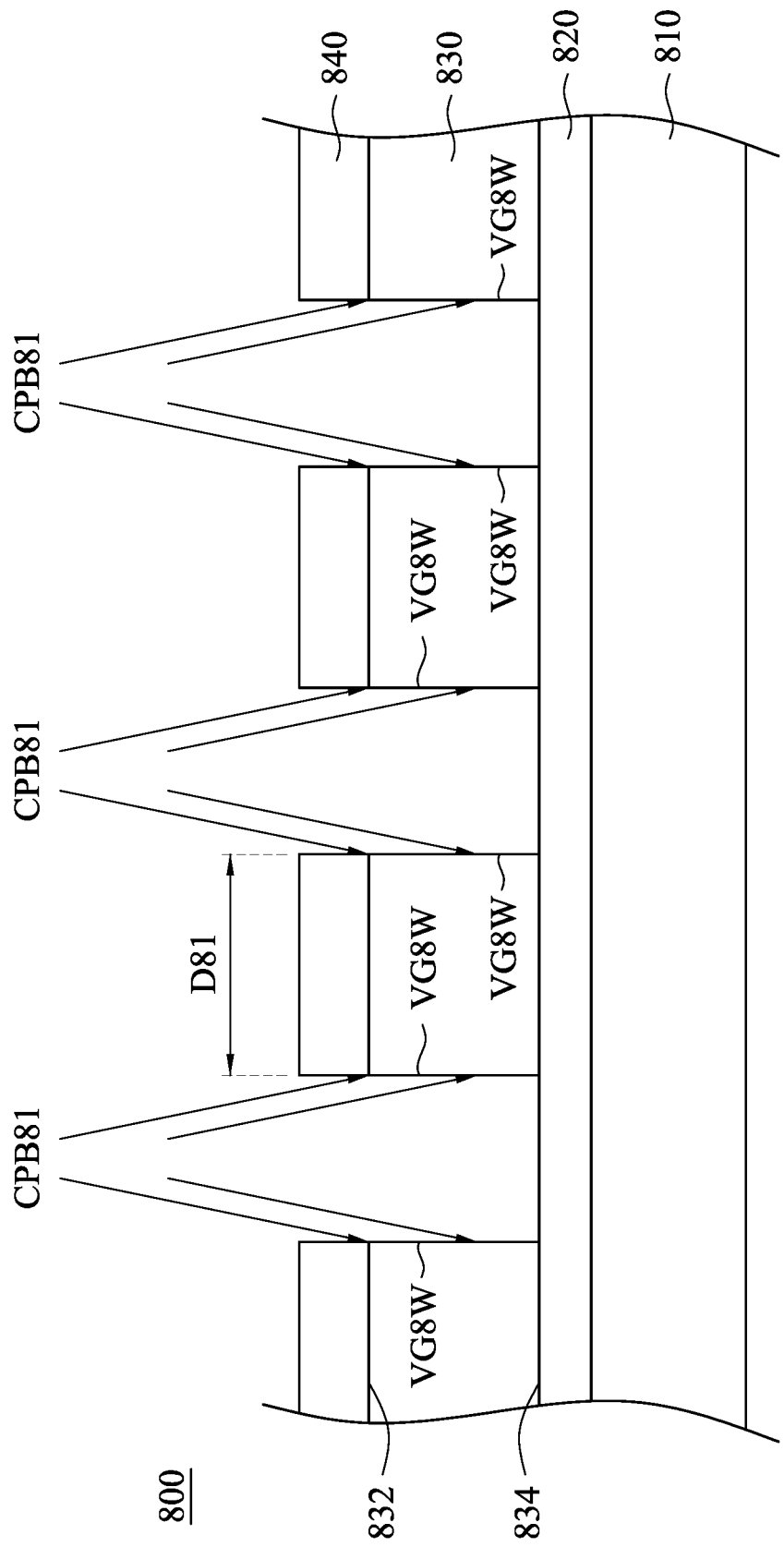
Fig. 8C(1)

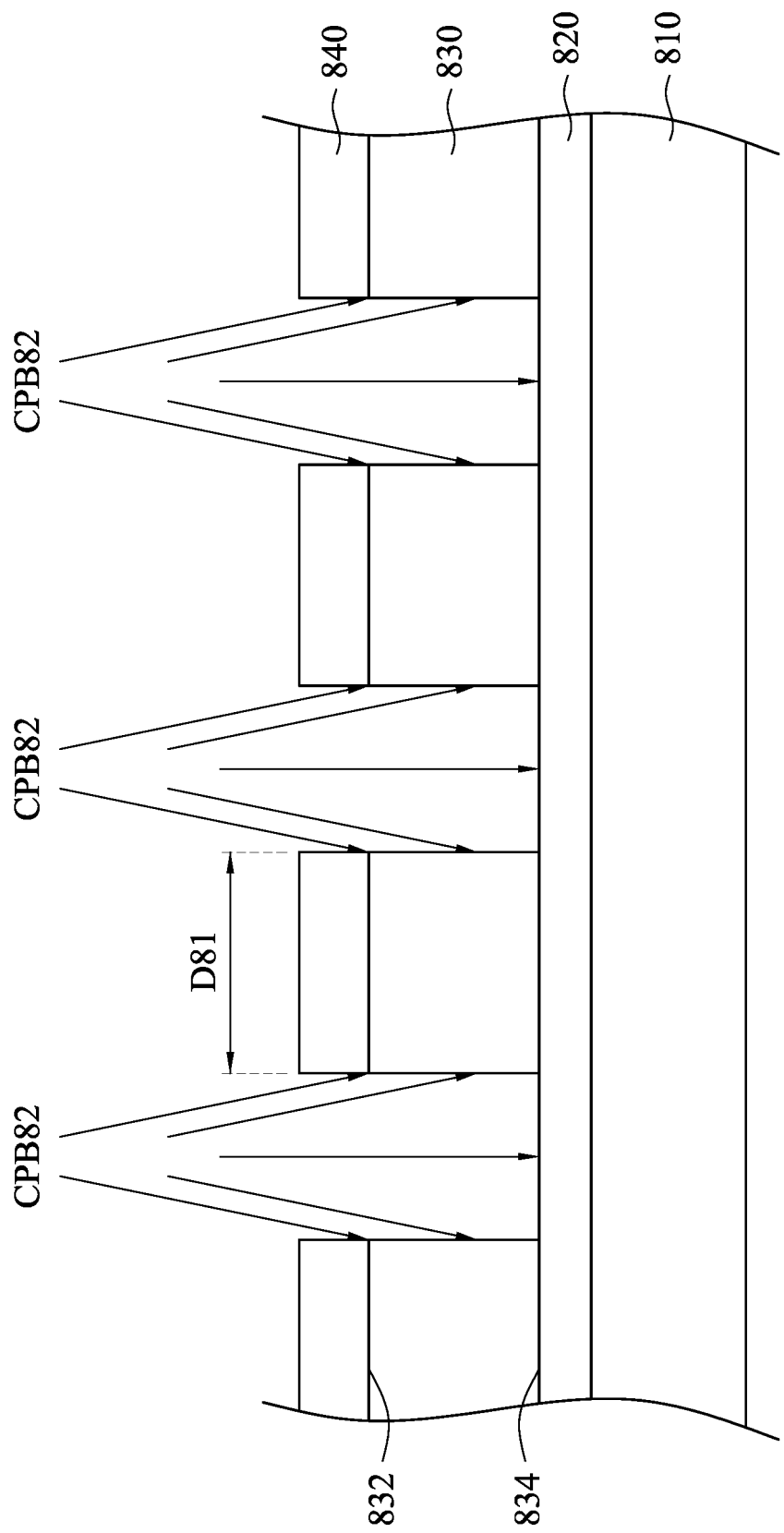
Fig. 8C(2)

METHOD AND EQUIPMENT FOR FORMING GAPS IN A MATERIAL LAYER

RELATED APPLICATION

This application claims the benefit of the Provisional Application Ser. No. 62/564,906, filed Sep. 28, 2017. The entire disclosures of all the above applications are hereby incorporated by reference herein.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, multi-layer interconnects are important in IC manufacturing. Interconnects electrically connect together different conductive wiring layers in a semiconductor chip. The conductive layers can be layers formed on a substrate surface, such as source/drain contacts or gate structures. Typically, etching technologies are used to form gaps for the multi-layer interconnects. However, as the scaling down process continues, conventional methods for forming gaps for the multi-layer interconnects have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2F to FIG. 2H are cross-sectional views showing filling of metal material in accordance with an embodiment of the present disclosure.

FIG. 8A to FIG. 8D are cross-sectional views of intermediate stages showing a method for forming gaps in accordance with an embodiment of the present disclosure.

DETAILED DESCRIPTION

Figure 1:
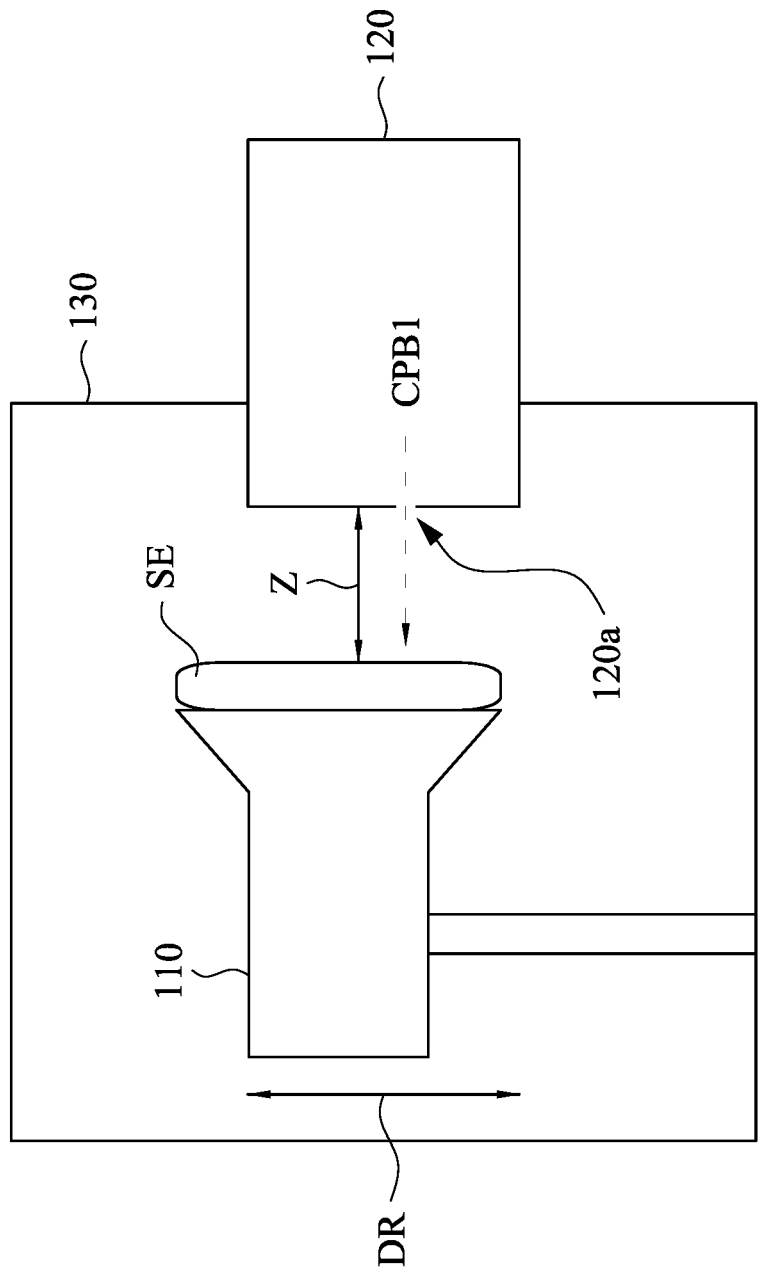
FIG. 1 is a schematic diagram showing equipment for forming gaps in a material layer of a semiconductor device in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a method and equipment for forming gaps in a material layer. The equipment includes a supporter configured to support a semiconductor device and an etching device configured to emit directional charged particle beams to etch the semiconductor device. The directional charged particle beams are provided with two energy peaks. In the method for forming gaps in a material layer, the directional charged particle beams are used to etch the material layer to form gaps each having a re-entrance profile.

Referring to FIG. 1, FIG. 1 is a schematic diagram showing equipment for forming gaps in a material layer of a semiconductor device SE. The equipment includes a supporter 110 and an etching device 120. The supporter 110 is located in a chamber 130 and configured to support the semiconductor device SE which is to be etched, and the etching device 120 is configured to etch the semiconductor device SE. In some embodiments, the support 110 is an electrostatic chuck configured to fix the semiconductor device SE on a surface of the support 110. However, embodiments of the present disclosure are not limited thereto.

The etching device 120 is configured to emit directional charged particle beams CPB1 to the semiconductor device SE to etch a material layer of the semiconductor device SE. In some embodiments, each of the directional charged particle beams CPB1 is a plasma beam and emitted from an aperture 120a of the etching device 120. In some embodiments, the gas of the directional charged particle beams CPB1 includes $CH_3F$ and $O_2$. In some embodiments, the gas of the directional charged particle beams CPB1 includes CH3F and Hz. In some embodiments, the gas of the directional charged particle beams CPB1 includes $O_2$ and $N_2$. In some embodiments, the gas of the directional charged particle beams CPB1 includes $H_2$ and $N_2$. In some embodiments, the gas of the directional charged particle beams CPB1 includes $C_4F_6$ and $O_2$. In some embodiments, the gas of the directional charged particle beams CPB1 includes $CF_4$, $CH_3F$ and Ar.

The energy peaks of the directional charged particle beams CPB1 and a vertical distance Z between the semiconductor device SE and the aperture 120a are determined in accordance with a predetermined profile of the gaps to be formed in the material layer of the semiconductor device SE. In some embodiments, the vertical distance Z is in a range between 7 mm to 15 mm. In some embodiments, each of the directional charged particle beams CPB1 is provided to have two peaks at symmetrical angles θ1 and θ2, in which the angle θ1 is in a range between 30 degrees and 1.3 degrees, and the angle θ2 is in a range between −30 degrees and −1.3 degrees. In some embodiments, each of the directional charged particle beams CPB1 is provided to have a single peak at 0 degree.

Further, when the material layer of the semiconductor device SE is etched, the semiconductor device SE is moved upward or downward by the support 110.

Figure 2A:
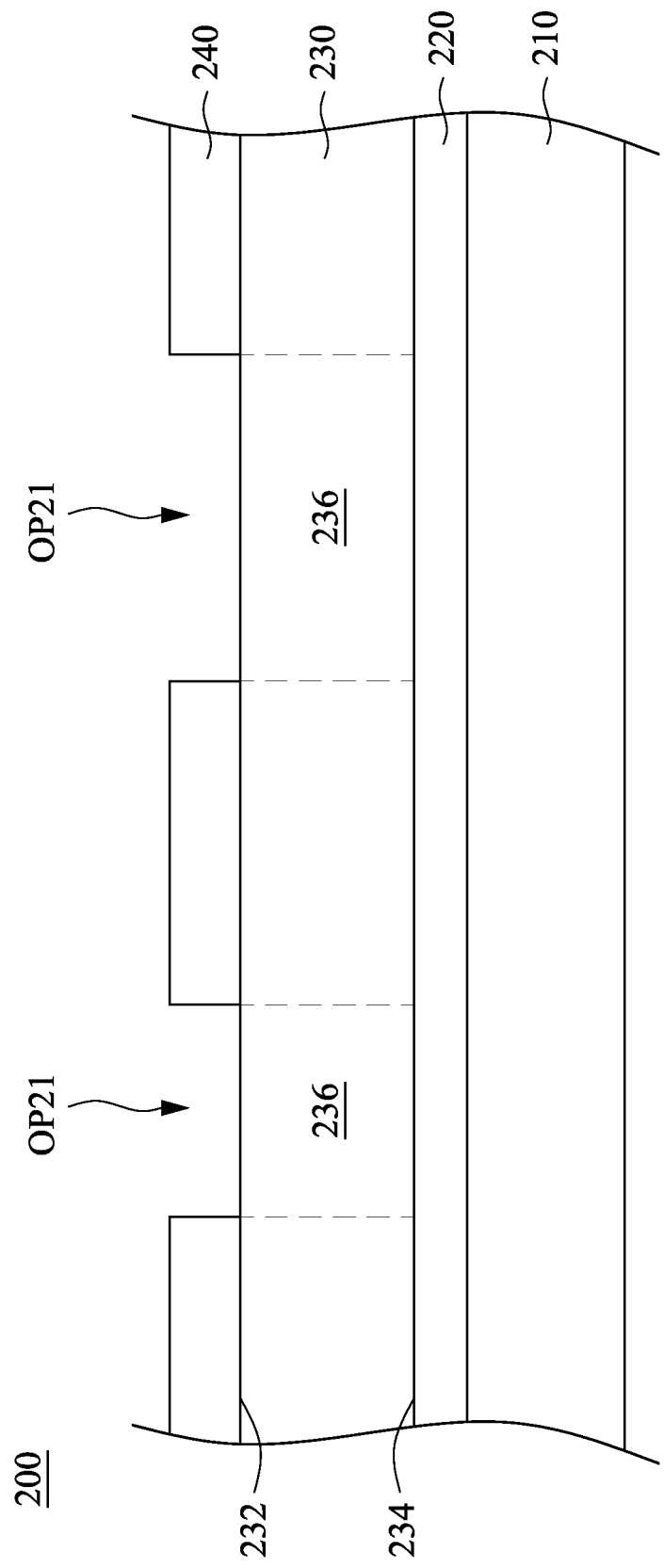
FIGS. 2A-2B and FIG. 2D-2E are cross-sectional views of intermediate stages showing a method for forming gaps in accordance with some embodiments of the present disclosure.

Referring to FIGS. 2A-2B and FIG. 2D-2E, FIG. 2A-2B and FIG. 2D-2E are cross-sectional views of intermediate stages showing a method for forming gaps in accordance with some embodiments of the present disclosure. As shown in FIG. 2A, a semiconductor device 200 to be etched is provided. The semiconductor device 200 includes a circuit layer 210, an etch stop layer 220, a material layer 230 and a mask layer 240. The circuit layer 210 may include active circuits or passive circuits. In some embodiments, the circuit layer 210 includes transistor circuits formed on a semiconductor substrate.

The etch stop layer 220 is disposed on the circuit layer 210. The etch stop layer 220 is used to protect the circuit layer 210 from being damaged by subsequent etching processes. In some embodiments, the etch stop layer 220 is formed by titanium nitride, silicon, silicon nitride, or oxide, but embodiments of the present disclosure are not limited thereto.

The material layer 230 is disposed on the etch stop layer 220. The material layer 230 is etched in the subsequent etching processes to form plural gaps for interconnection. The material layer 230 has a top surface 232 and a bottom surface 234. The top surface 232 is adjacent to the mask layer 240, and the bottom surface 234 is adjacent to the etch stop layer 220. In some embodiments, the material layer 230 is formed by silicon nitride, spin-on-carbon, or silicon oxide, but embodiments of the present disclosure are not limited thereto.

The mask layer 240 is disposed on the material layer 230. The mask layer 240 is formed to have openings OP21, thereby exposing portions 236 of the material layer 230. In some embodiments, the mask layer 240 is formed by a photoresist bottom layer, silicon oxide, or silicon nitride, but embodiments of the present disclosure are not limited thereto.

Figure 2B:
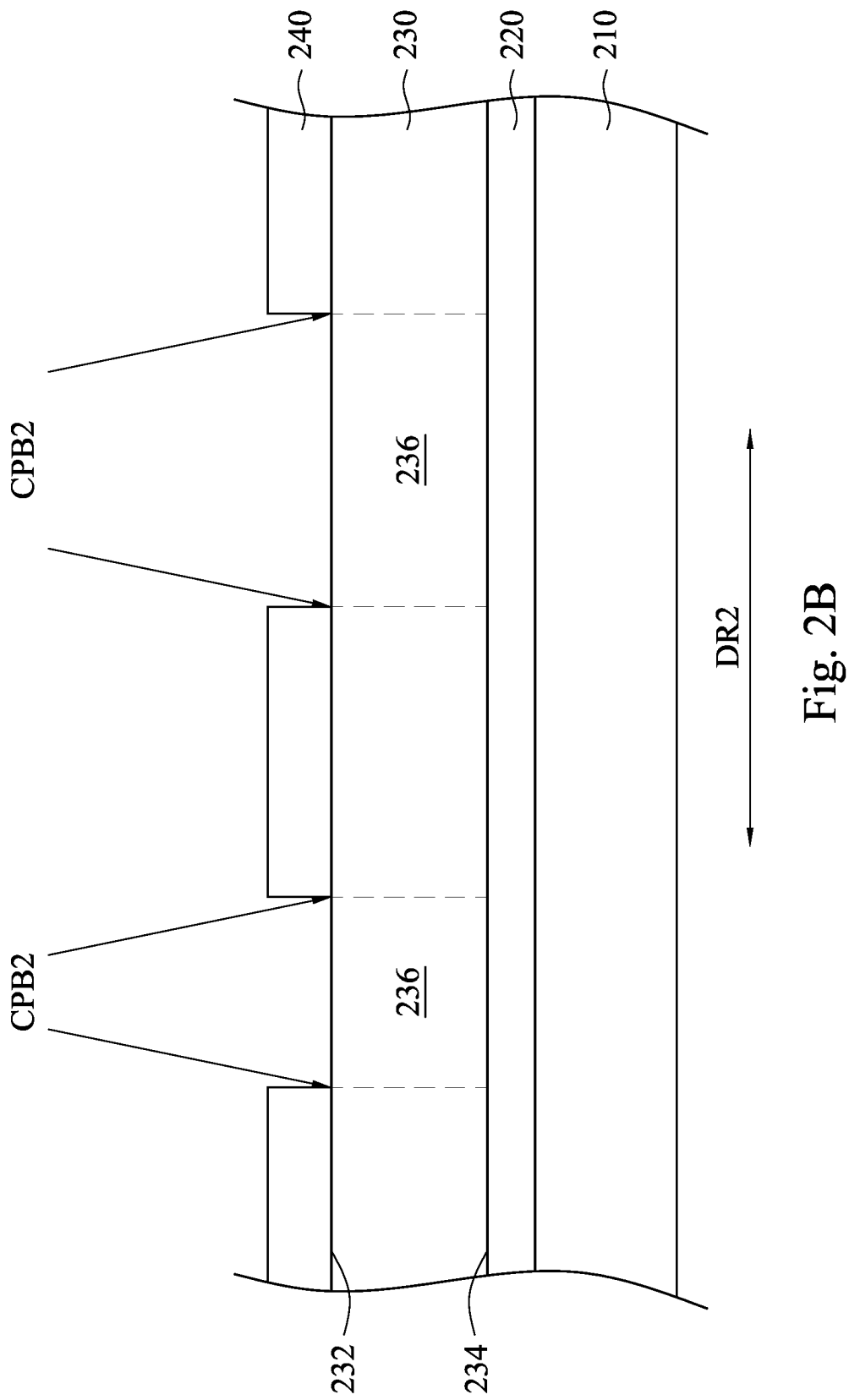
Figure 2C:
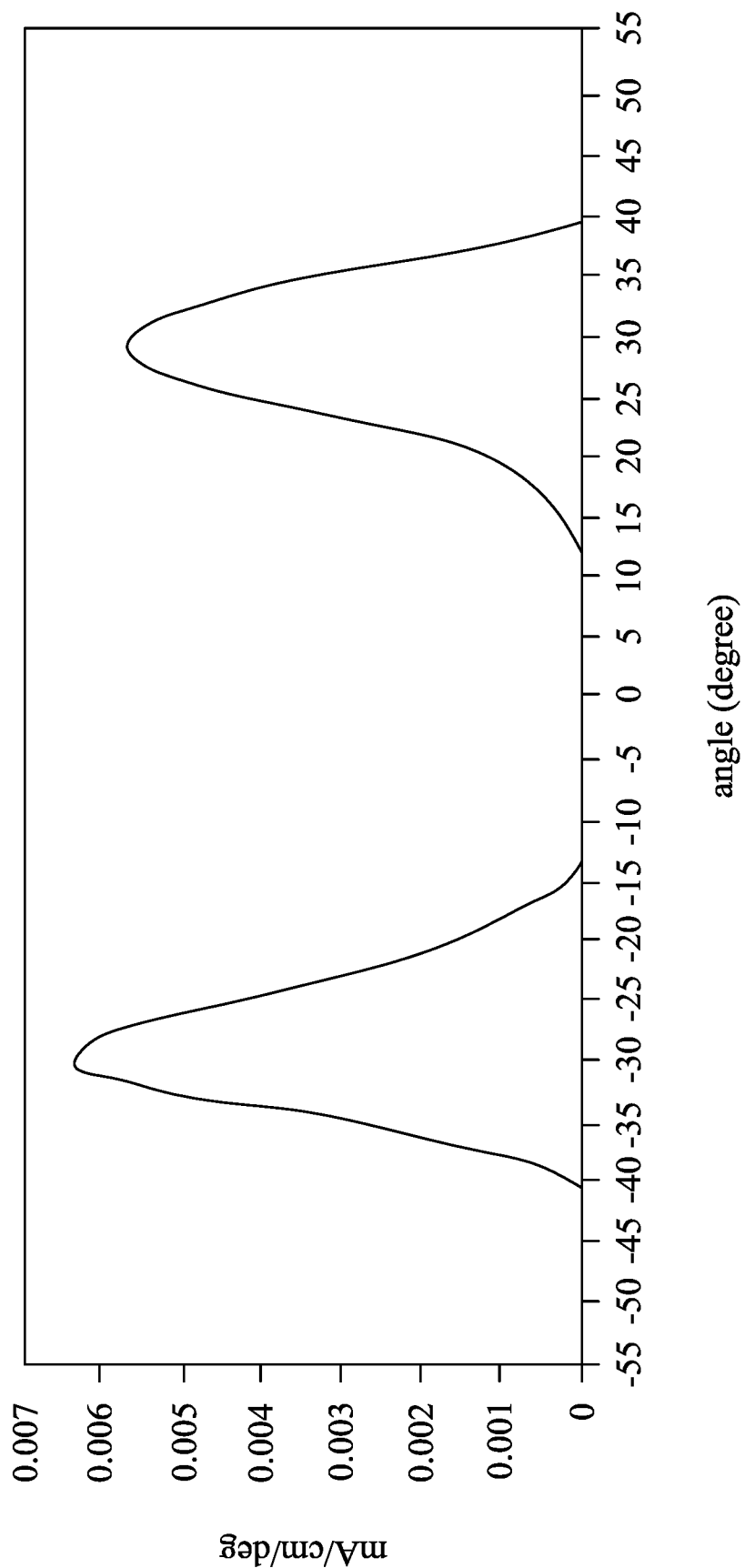
FIG. 2C is a schematic diagram showing a single peak of the directional charged particle beam in accordance with an embodiment of the present disclosure.

As shown in FIG. 2B, the material layer 230 is etched by using directional charged particle beams CPB2. In some embodiments, equipment used to etch the material layer 230 is similar to the equipment shown in FIG. 1. The directional charged particle beams CPB2 are similar to the directional charged particle beams CPB1 and provided to have two peaks as shown in FIG. 2C. In some embodiments, the two peaks correspond to two predetermined angles substantially 30 degrees and −30 degrees. In some embodiments, the two peaks correspond to two predetermined angles substantially 8 degrees and −8 degrees. In some embodiments, the two peaks correspond to two predetermined angles substantially 1.3 degrees and −1.3 degree. Further, the semiconductor device 200 can be moved along a direction DR2 when being etched.

Figure 2D:
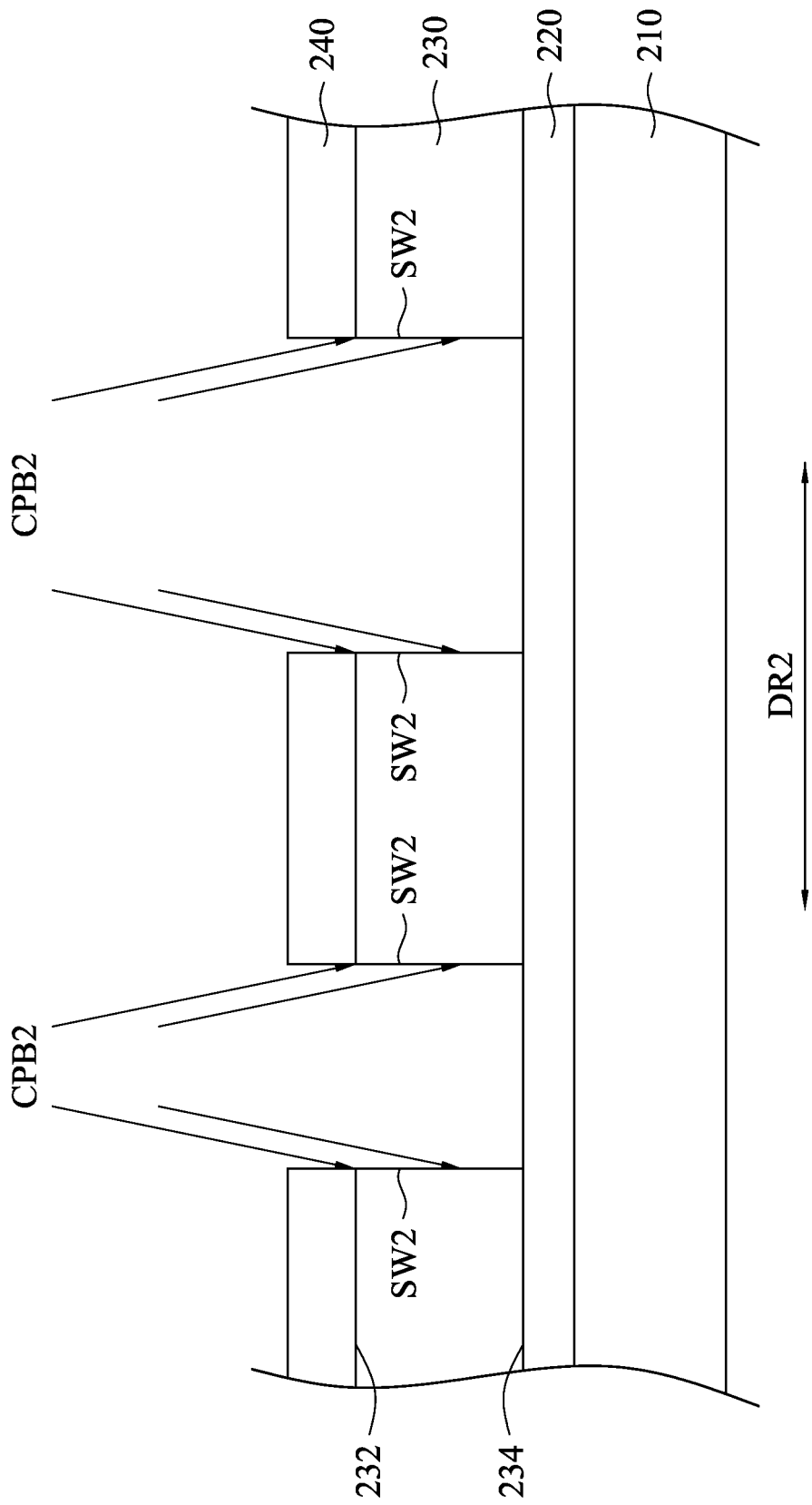
Figure 2E:
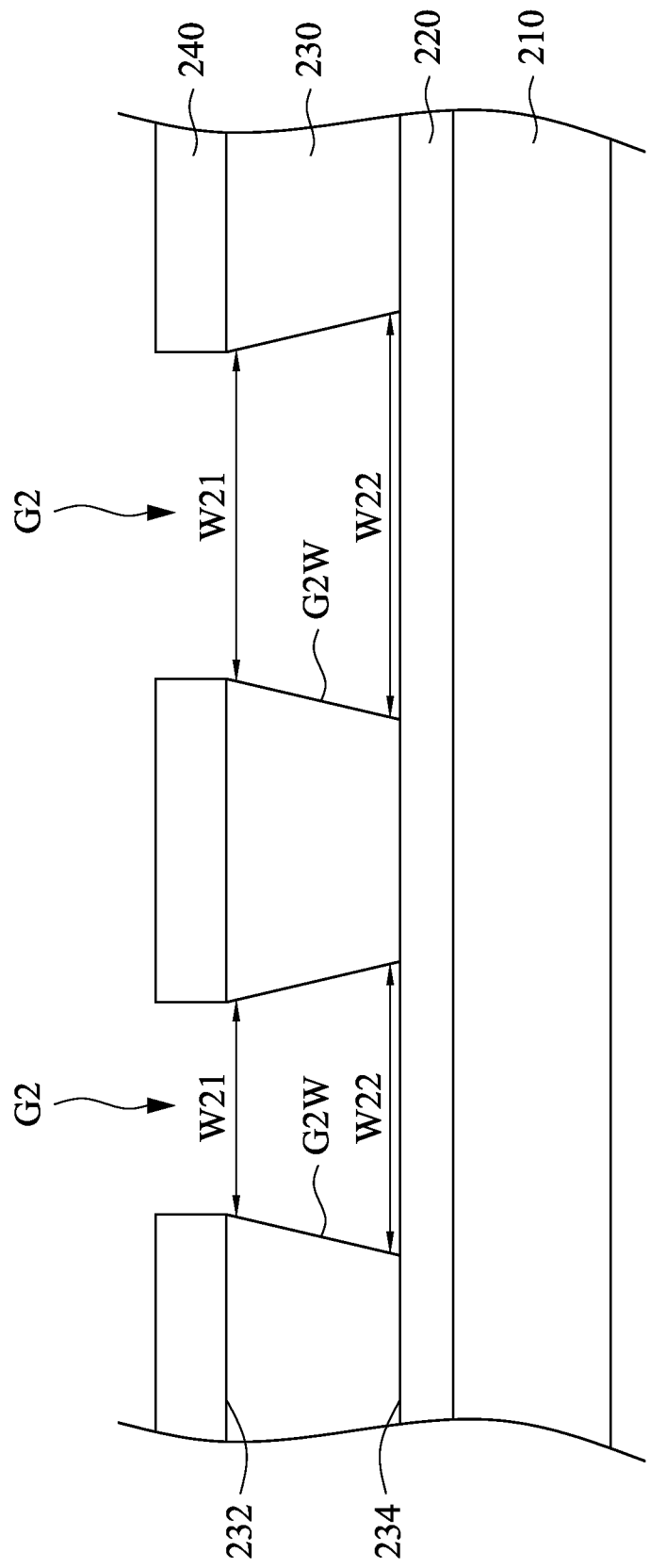

Because the exposed portions 236 of the material layer 230 are not covered by the mask layer 240, and the semiconductor device 200 is moved when being etched, the exposed portions 236 of the material layer 230 are removed, as shown in FIG. 2D. Then, sidewalls SW2 of the material layer 230 are etched by the directional charged particle beams CPB2 to form gaps G2 each having a re-entrance profile in the material layer 230, as shown in FIG. 2E. The gap G2 having the re-entrance profile has a top portion adjacent to the top surface 232 and a bottom portion adjacent to the bottom surface 234, and the top portion of the gap G2 has a width W21 smaller than a width W22 of the bottom portion of the gap G2, because the gap G2 have inclined sidewalls G2W.

Figure 2G:
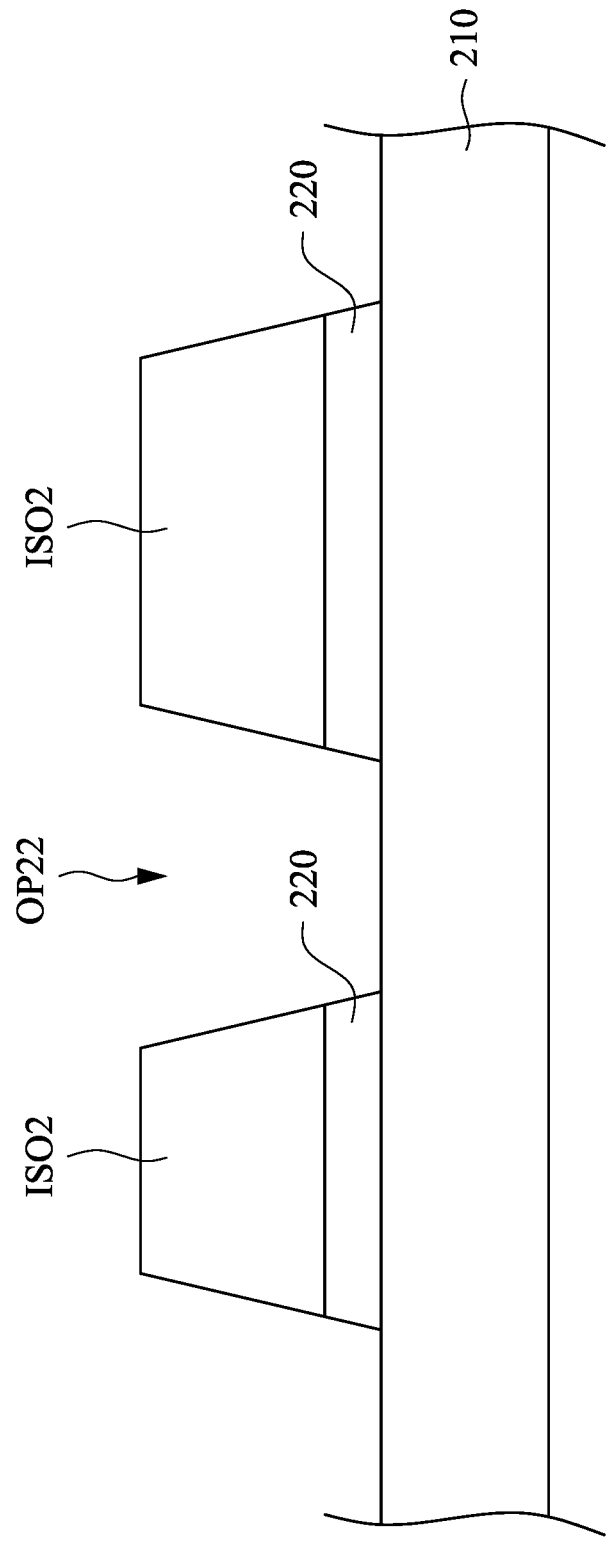
Figure 2H:
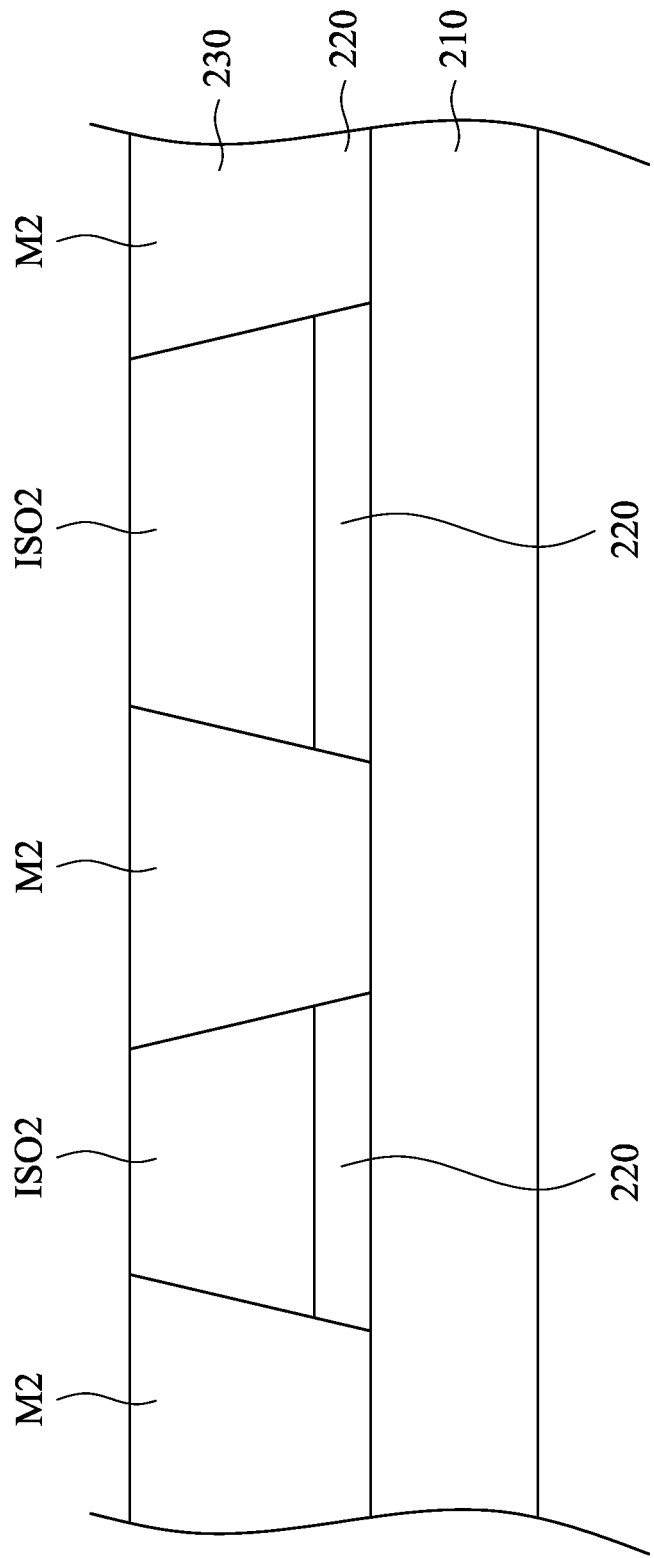

The gaps G2 having the re-entrance profile benefits formation of interconnections. Referring to FIG. 2F to FIG. 2H, FIG. 2F to FIG. 2H are cross-sectional views showing filling of metal material in accordance with an embodiment of the present disclosure. After the gaps G2 are formed, isolation layers ISO2 are formed in the gaps G2, as shown in FIG. 2F. In some embodiments, isolation layers ISO2 are formed from silicon nitride, but embodiments of the present disclosure are not limited thereto. Thereafter, the material layer 230 and the etch stop layer 220 located under the material layer 230 are sequentially removed, thereby forming plural openings (for example, the opening OP22) between the isolation layers ISO2, as shown in FIG. 2G. Then, the openings located between isolation layers ISO2 are filled with the metal material M2, as shown FIG. 2H. Because the isolation layers ISO2 in the gaps G2 are formed to have the re-entrance profile, the metal material M2 located between the isolation layers ISO2 is formed to have a taper profile and without void or seam. Therefore, gaps G2 having the re-entrance profile benefits the filling of the metal material M2.

Figure 3A:
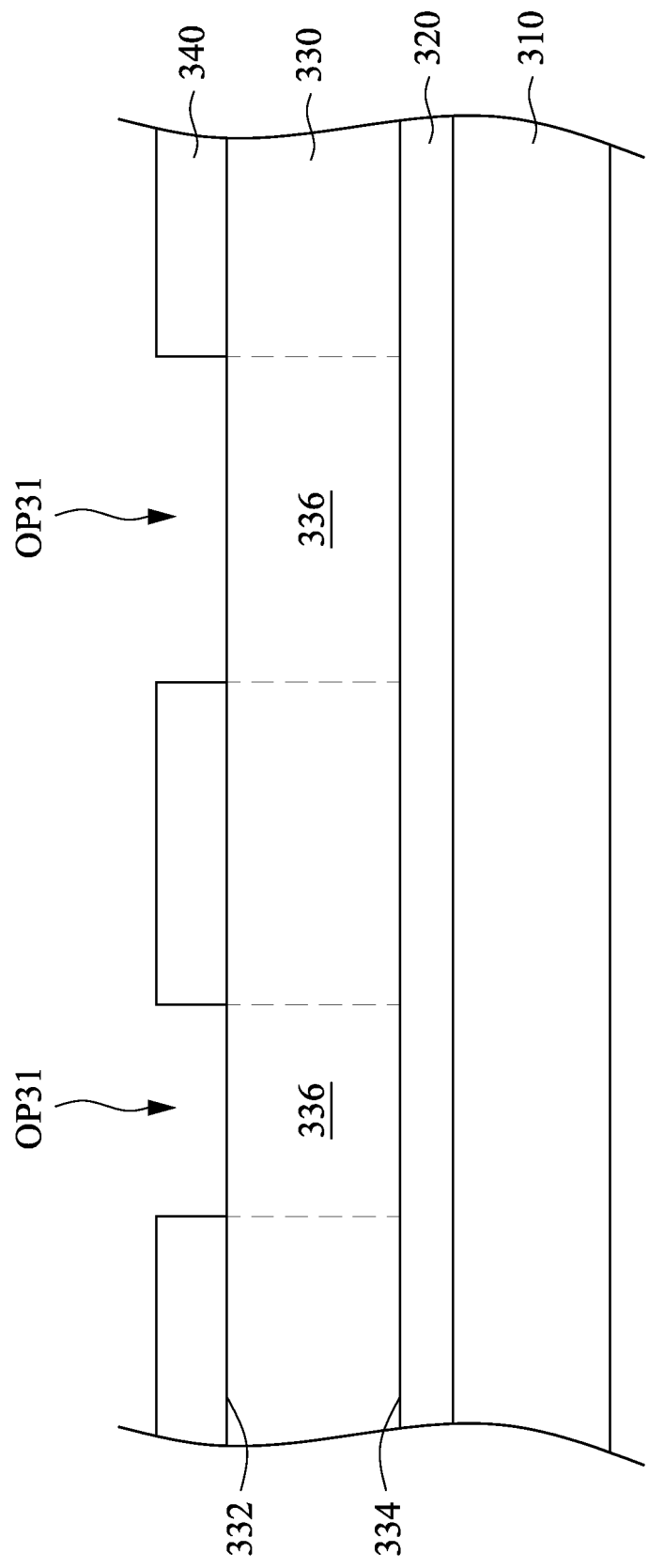
FIGS. 3A-3B and FIG. 3D-3E are cross-sectional views of intermediate stages showing a method for forming gaps in accordance with an embodiment of the present disclosure.

Referring to FIGS. 3A-3B and FIG. 3D-3E, FIGS. 3A-3B and FIGS. 3D-3E are cross-sectional views of intermediate stages showing a method for forming gaps in accordance with an embodiment of the present disclosure. As shown in FIG. 3A, a semiconductor device 300 to be etched is provided. The semiconductor device 300 includes a circuit layer 310, an etch stop layer 320, a material layer 330 and a mask layer 340. The circuit layer 310 may include active circuits or passive circuits. In some embodiments, the circuit layer 310 includes transistor circuits formed on a semiconductor substrate.

The etch stop layer 320 is disposed on the circuit layer 310. The etch stop layer 320 is used to protect the circuit layer 310 from being damaged by subsequent etching processes. In some embodiments, the etch stop layer 320 is formed by titanium nitride, silicon, silicon nitride, or oxide, but embodiments of the present disclosure are not limited thereto.

The material layer 330 is disposed on the etch stop layer 320. The material layer 330 is etched in the subsequent etching processes to form plural gaps for interconnection. The material layer 330 has a top surface 332 and a bottom surface 334. The top surface 332 is adjacent to the mask layer 340, and the bottom surface 334 is adjacent to the etch stop layer 320. In some embodiments, the material layer 330 is formed by silicon nitride, spin-on-carbon, or silicon oxide, but embodiments of the present disclosure are not limited thereto.

The mask layer 340 is disposed on the material layer 330. The mask layer 340 is formed to have openings OP31, thereby exposing portions 332 of the material layer 330. In some embodiments, the mask layer 340 is formed by a photoresist bottom layer, silicon oxide, or silicon nitride, but embodiments of the present disclosure are not limited thereto.

Figure 3B:
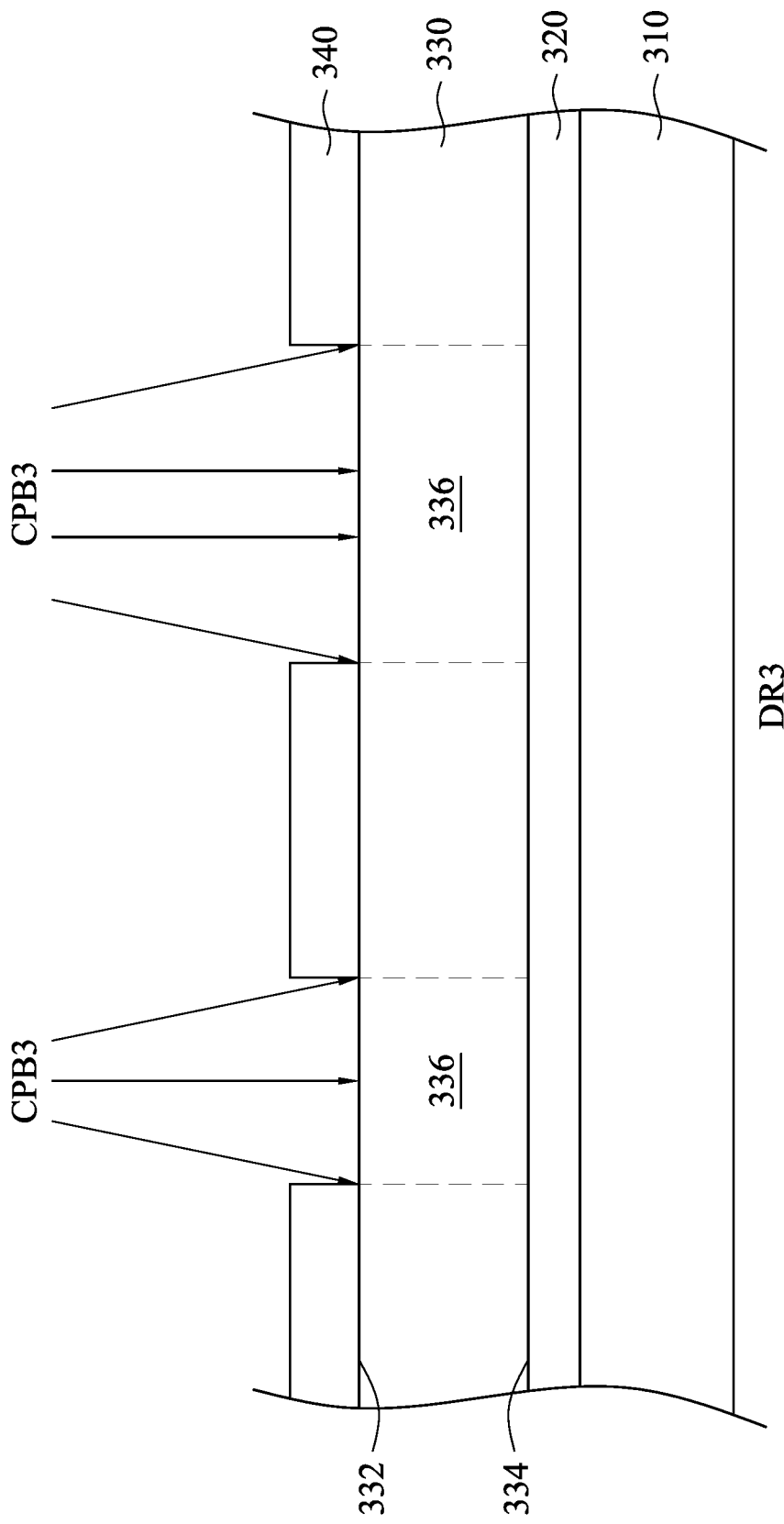
Figure 3C:
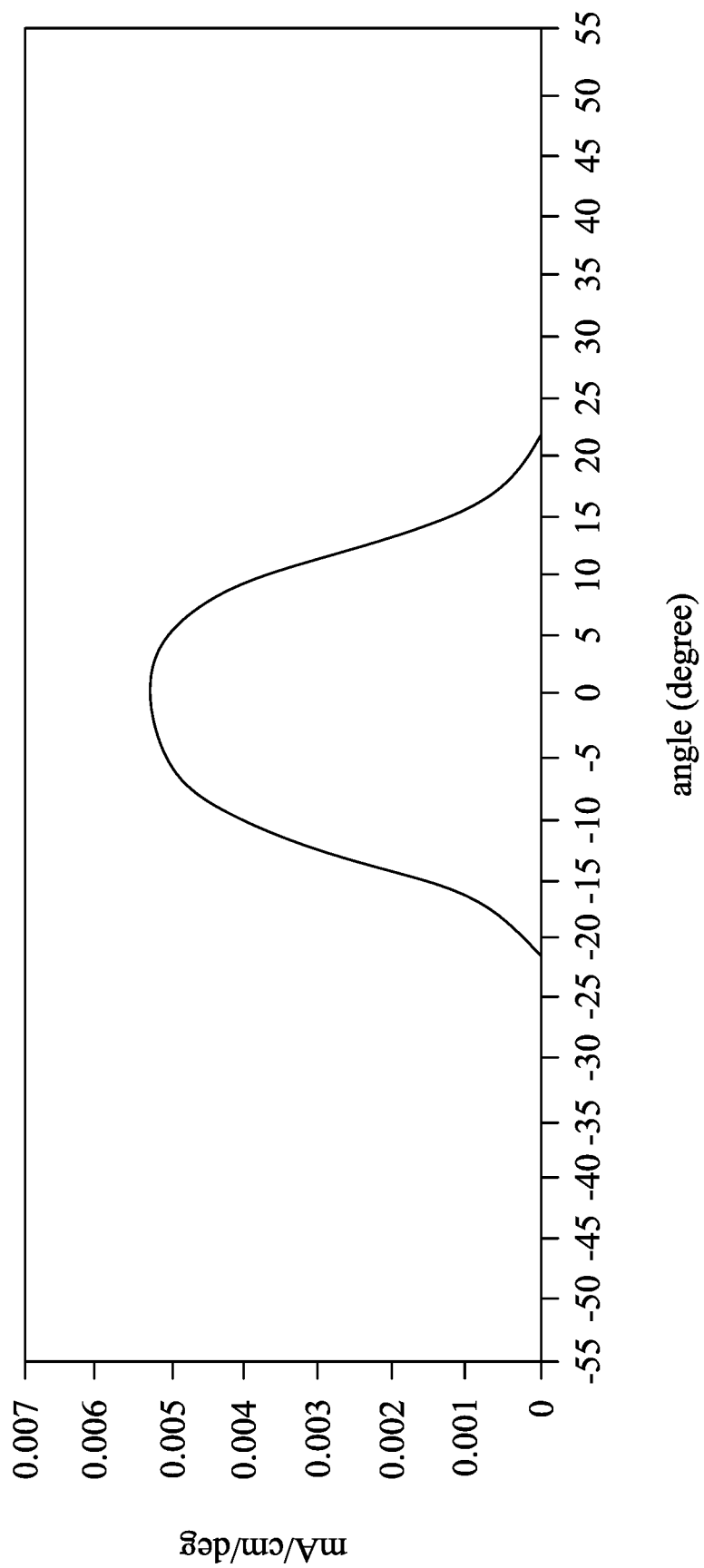
FIG. 3C is a schematic diagram showing a single peak of the directional charged particle beam in accordance with an embodiment of the present disclosure.

As shown in FIG. 3B, the material layer 330 is etched by using directional charged particle beams CPB3. In some embodiments, equipment used to etch the material layer 330 is similar to the equipment shown in FIG. 1. The directional charged particle beams CPB3 are similar to the directional charged particle beams CPB1, in which each of the directional charged particle beams CPB3 is provided to have a single peak as shown in FIG. 3C. The single peak corresponds to a predetermined angle substantially 0 degree. Further, the semiconductor device 300 can be moved along a direction DR3 when being etched.

Figure 3D:
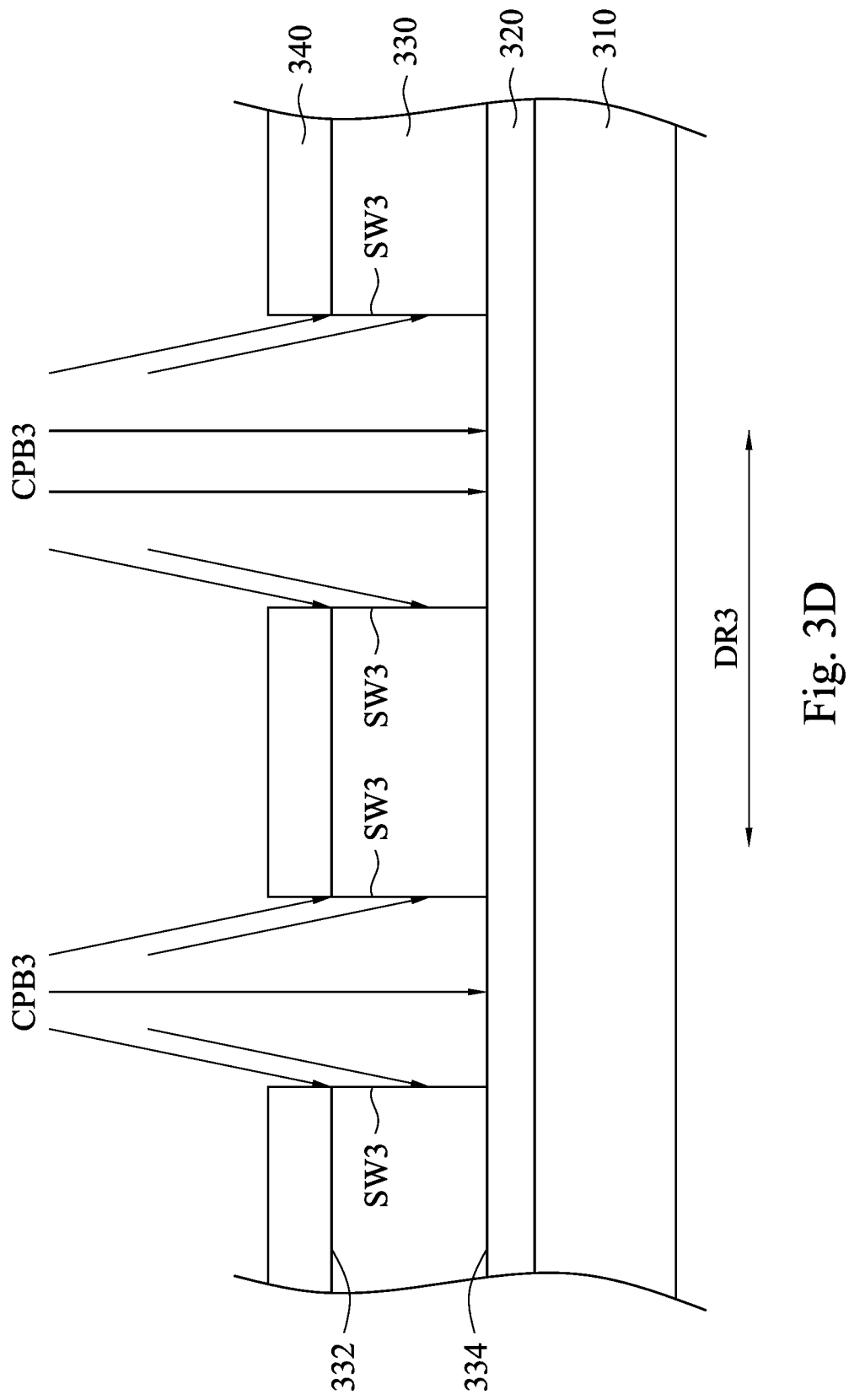
Figure 3E:
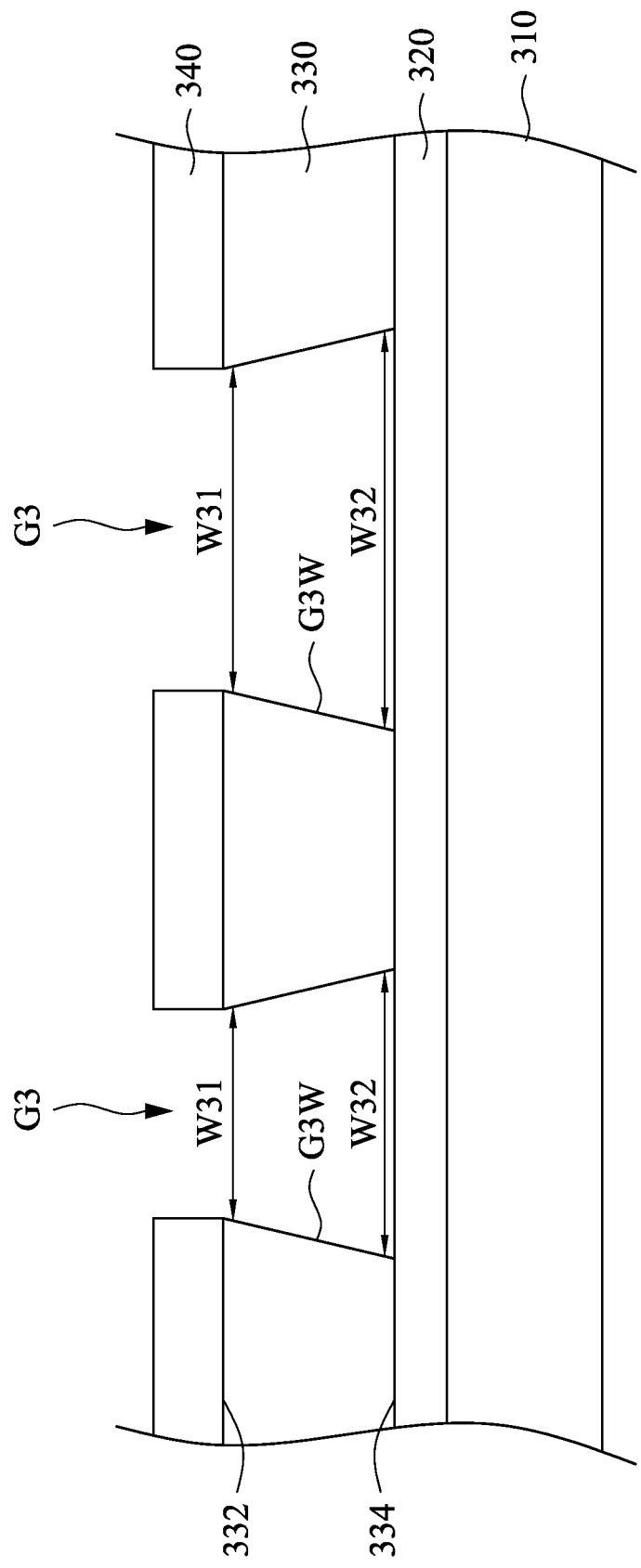

Because the exposed portions 336 of the material layer 330 are not covered by the mask layer 340, and the semiconductor device 300 is moved when being etched, the exposed portions 336 of the material layer 330 are removed, as shown in FIG. 3C. Then, sidewalls SW3 of the material layer 330 are etched by the directional charged particle beams CPB3 to form gaps G3 each having a re-entrance profile in the material layer 330, as shown in FIG. 3E. The gap G3 having the re-entrance profile has a top portion adjacent to the top surface 332 and a bottom portion adjacent to the bottom surface 234, and the top portion of the gap G3 has a width W31 smaller than a width W32 of the bottom portion of the gap G3, because the gap G3 have inclined sidewalls G3W.

Similar to the gaps G2, the gaps G3 having the re-entrance profile also benefit formation of interconnections.

Figure 4A:
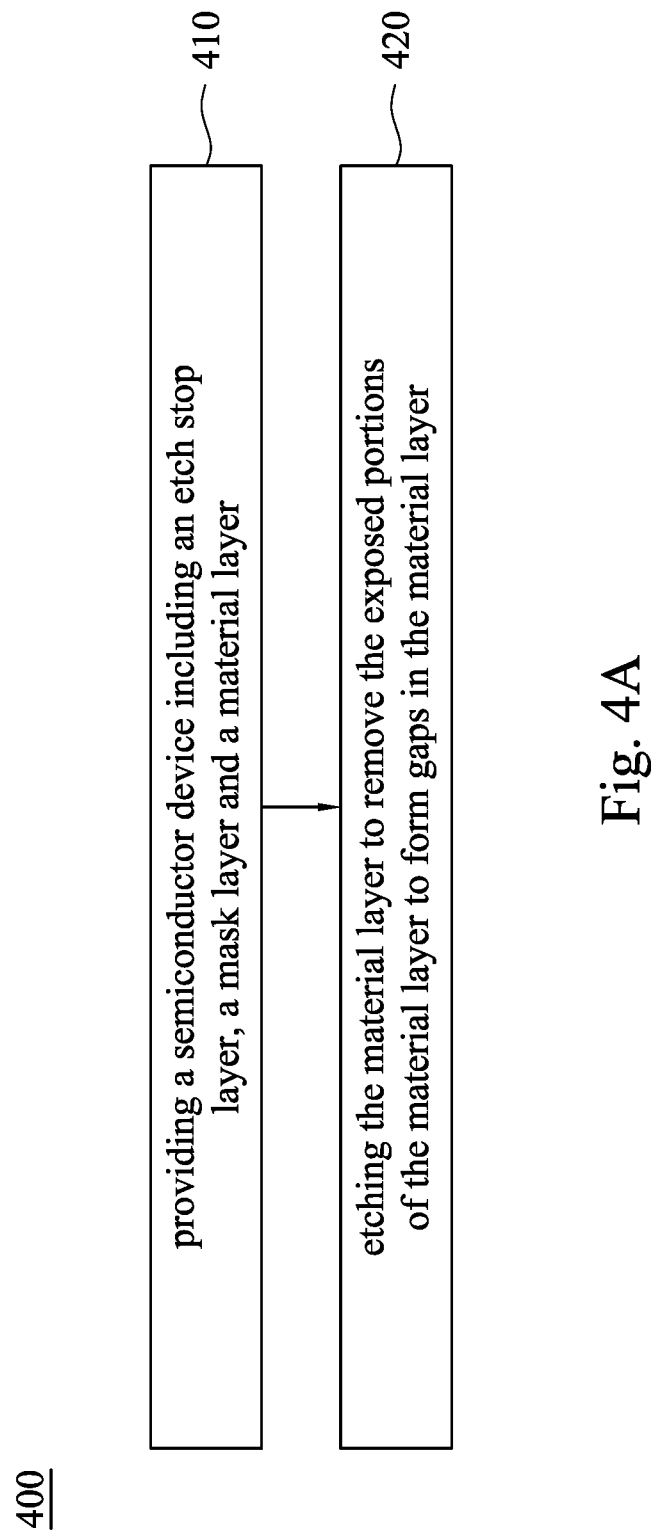
FIG. 4A is a flow chart of a method for forming gaps in a material layer in accordance with an embodiment of the present disclosure.

Referring to FIG. 4A, FIG. 4A is a flow chart of a method 400 for forming gaps in a material layer in accordance with an embodiment of the present disclosure. The method 400 begins at operation 410. In operation 410, a semiconductor device including an etch stop layer, a material layer and a mask layer is provided. For example, the semiconductor device 200 including the etch stop layer 220, the material layer 230 and the mask layer 240 is provided as shown in FIG. 2A. For another example, the semiconductor device 300 including the etch stop layer 320, the material layer 330 and the mask layer 340 is provided as shown in FIG. 3A.

Figure 4B:
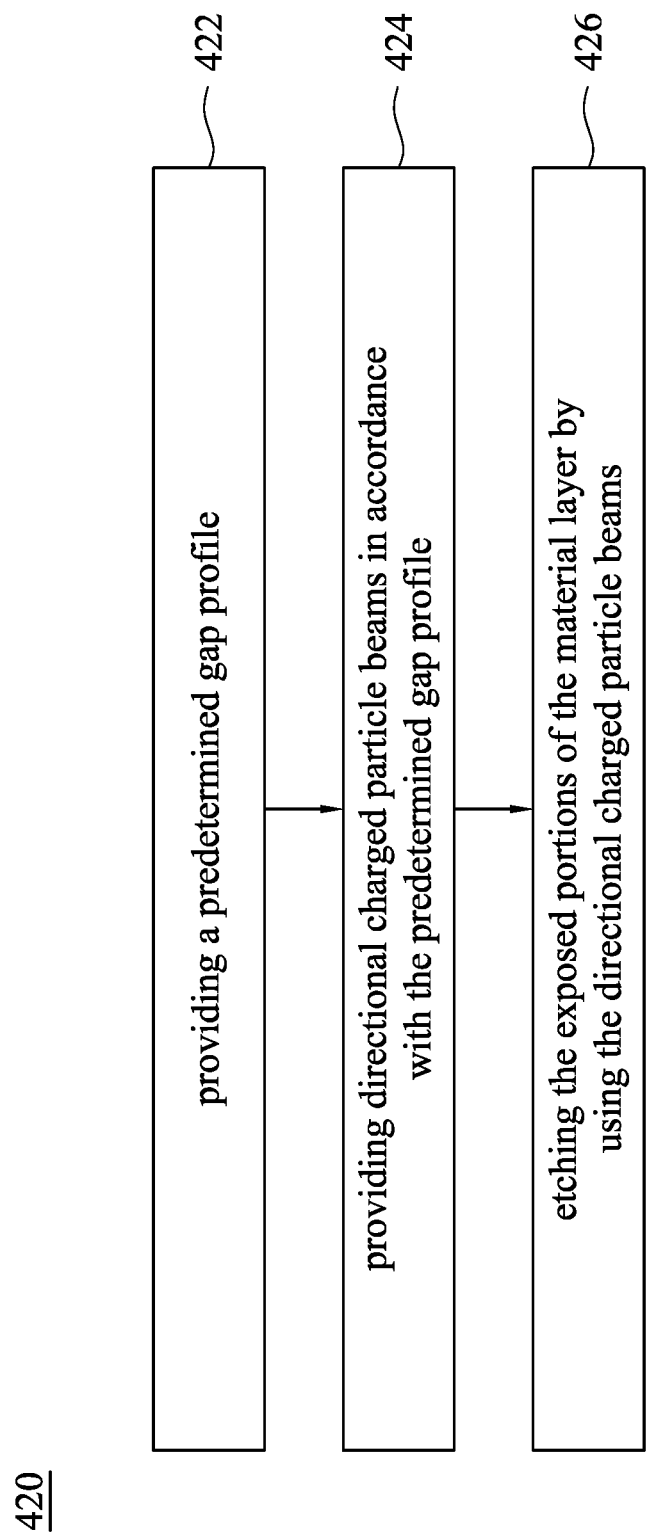
FIG. 4B is a flow chart of the operation for etching the material layer in accordance with an embodiment of the present disclosure.

Then, in operation 420, a material layer of the semiconductor device is etched to remove exposed portions of the material layer. For example, the material layer 230 is etched to remove the exposed portions 236 of the material layer 230 as shown in FIG. 2E. For another example, the material layer 330 is etched to remove the exposed portions 336 of the material layer 330 as shown in FIG. 3E Referring to FIG. 4B, FIG. 4B is a flow chart of operation 420 for etching the material layer. Operation 420 begins at operation 422. In operation 422, a predetermined gap profile is provided. In some embodiments, the predetermined gap profile is the re-entrance profile, but embodiments of the present disclosure are not limited thereto. Then, in operation 424, directional charged particle beams are provided in accordance with the predetermined gap profile. For example, the directional charged particle beams CPB2 having two peaks are provided. For another example, the directional charged particle beams CPB3 having a single peak are provided.

Further, in some embodiments, the vertical distance Z (shown in FIG. 1) between the semiconductor device and the aperture is determined in accordance with the predetermined gap profile, and the directional charged particle beams CPB2 are provided in accordance with the vertical distance Z and the predetermined gap profile. In some embodiments, the directional charged particle beams CPB2 having two peaks corresponding to two angles substantially 30 degrees and −30 degrees are provided when the vertical distance Z is substantially 15 mm. In some embodiments, the directional charged particle beams CPB2 having two peaks corresponding to two angles substantially 8 degrees and −8 degrees are provided when the vertical distance Z is substantially 8.5 mm. In some embodiments, the directional charged particle beams CPB2 having two peaks corresponding to two angles substantially 1.3 degrees and −1.3 degrees are provided when the vertical distance Z is substantially 7 mm.

Thereafter, in operation 426, the exposed portions of the material layer are etched. For example, the exposed portions 236 of the material layer 230 are etched by using the directional charged particle beams CPB2, as shown in FIG. 2B and FIG. 2D. For another example, the exposed portions 336 of the material layer 330 are etched by using the directional charged particle beams CPB3, as shown in FIG. 3B and FIG. 3D.

Figure 5A:
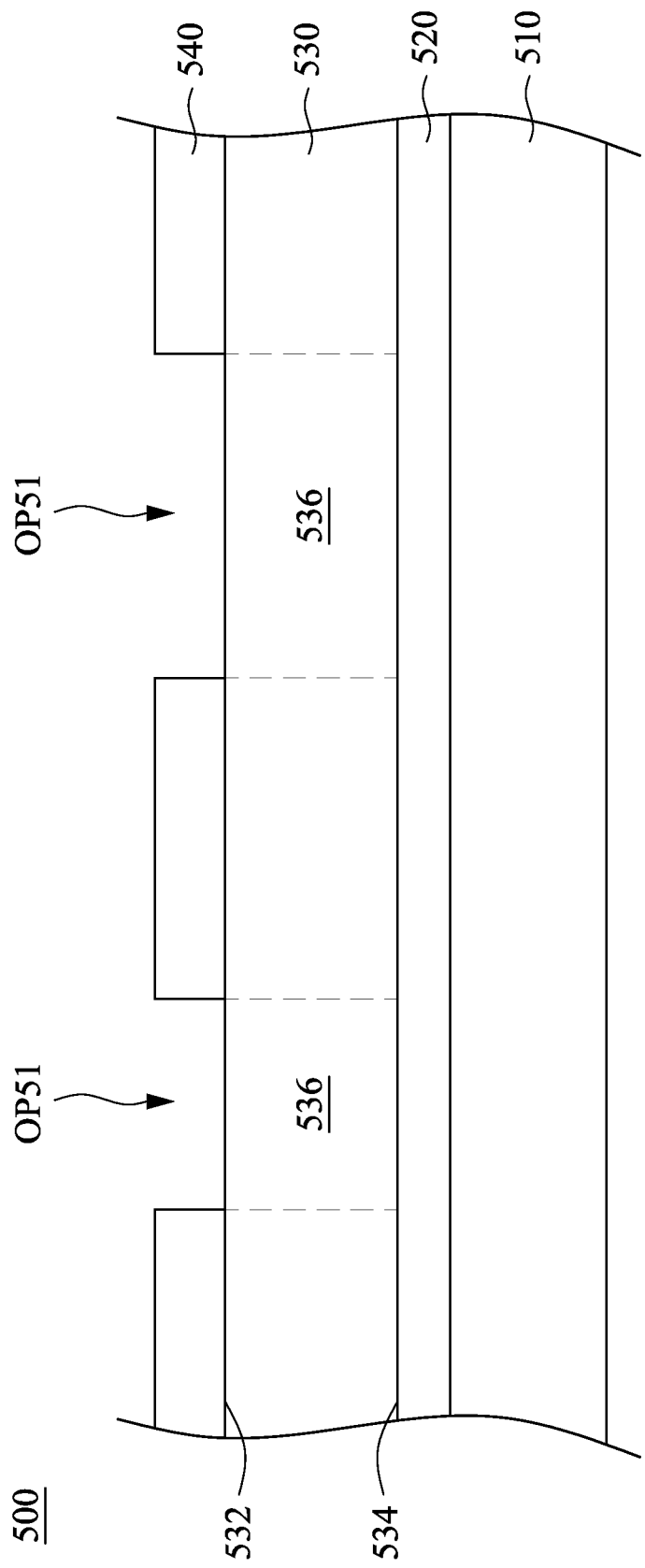
FIG. 5A to FIG. 5D are cross-sectional views of intermediate stages showing a method for forming gaps in accordance with an embodiment of the present disclosure.

Referring to FIG. 5A to FIG. 5D, FIG. 5A to FIG. 5D are cross-sectional views of intermediate stages showing a method for forming gaps in accordance with an embodiment of the present disclosure. As shown in FIG. 5A, a semiconductor device 500 to be etched is provided. The semiconductor device 500 includes a circuit layer 510, an etch stop layer 520, a material layer 530 and a mask layer 540. The circuit layer 510 may include active circuits or passive circuits. In some embodiments, the circuit layer 510 includes transistor circuits formed on a semiconductor substrate.

The etch stop layer 520 is disposed on the circuit layer 510. The etch stop layer 520 is used to protect the circuit layer 510 from being damaged by subsequent etching processes. In some embodiments, the etch stop layer 520 is formed by titanium nitride, silicon, silicon nitride, or oxide, but embodiments of the present disclosure are not limited thereto.

The material layer 530 is disposed on the etch stop layer 520. The material layer 530 is etched in the subsequent etching processes to form plural gaps for interconnection. The material layer 530 has a top surface 532 and a bottom surface 534. The top surface 532 is adjacent to the mask layer 540, and the bottom surface 534 is adjacent to the etch stop layer 520. In some embodiments, the material layer 530 is formed by silicon nitride, spin-on-carbon, or silicon oxide, but embodiments of the present disclosure are not limited thereto.

The mask layer 540 is disposed on the material layer 530. The mask layer 540 is formed to have openings OP51, thereby exposing portions 536 of the material layer 530. In some embodiments, the mask layer 540 is formed by a photoresist bottom layer, silicon oxide, or silicon nitride, but embodiments of the present disclosure are not limited thereto.

Figure 5B:
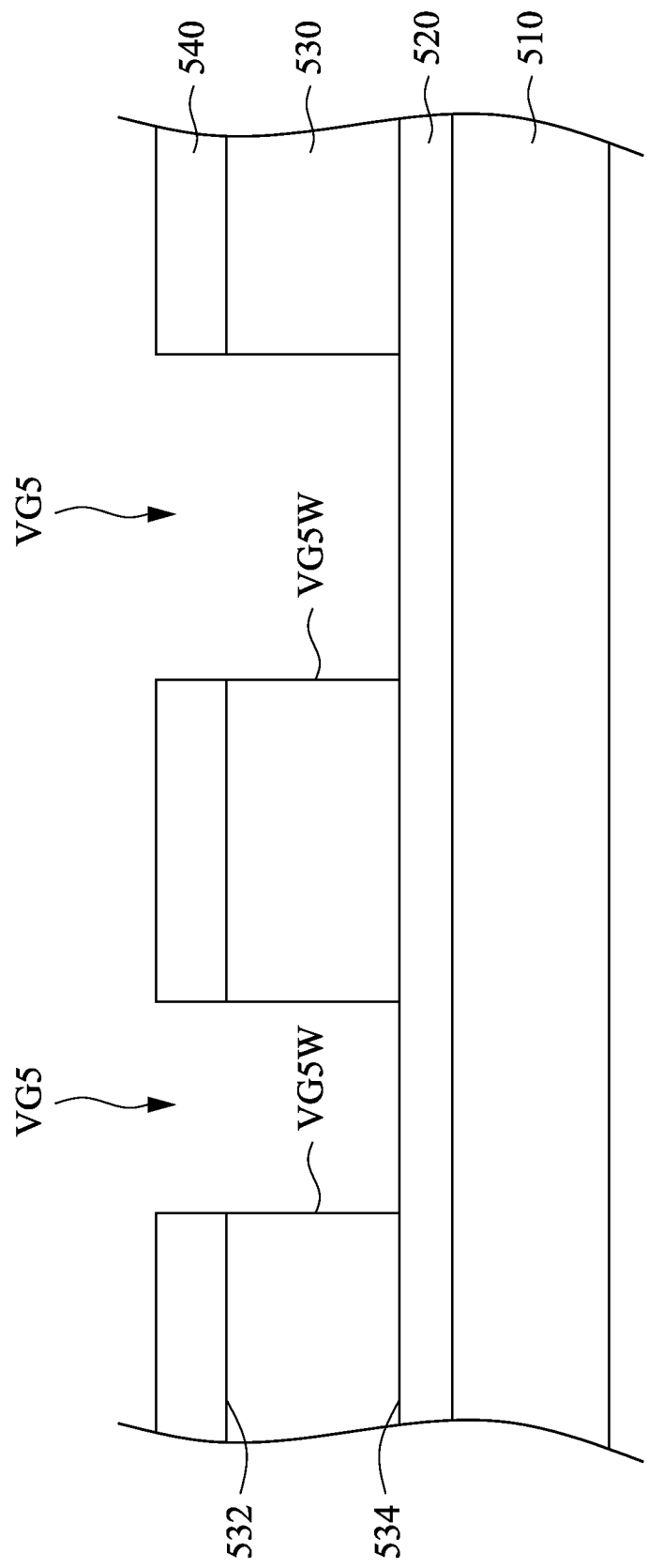

As shown in FIG. 5B, the material layer 530 is etched to form plural vertical gaps VG5 in the material layer 530. Because the exposed portions 536 of the material layer 530 are not covered by the mask layer 540, the exposed portions 536 of the material layer 530 are removed, thereby forming the vertical gaps VG5. Each of the vertical gaps VG5 has a vertical sidewall VGSW orthogonal to the top surface 532 and the bottom surface 534 of the material layer 530, and the vertical sidewalls VGSW extend from the bottom surface 534 of the material layer 530 to the top surface 532 of the material layer 530. In some embodiments, the material layer 530 is etched by using a wet etching process to form the vertical gaps VG5, but embodiments of the present invention are not limited thereto.

Figure 5C:
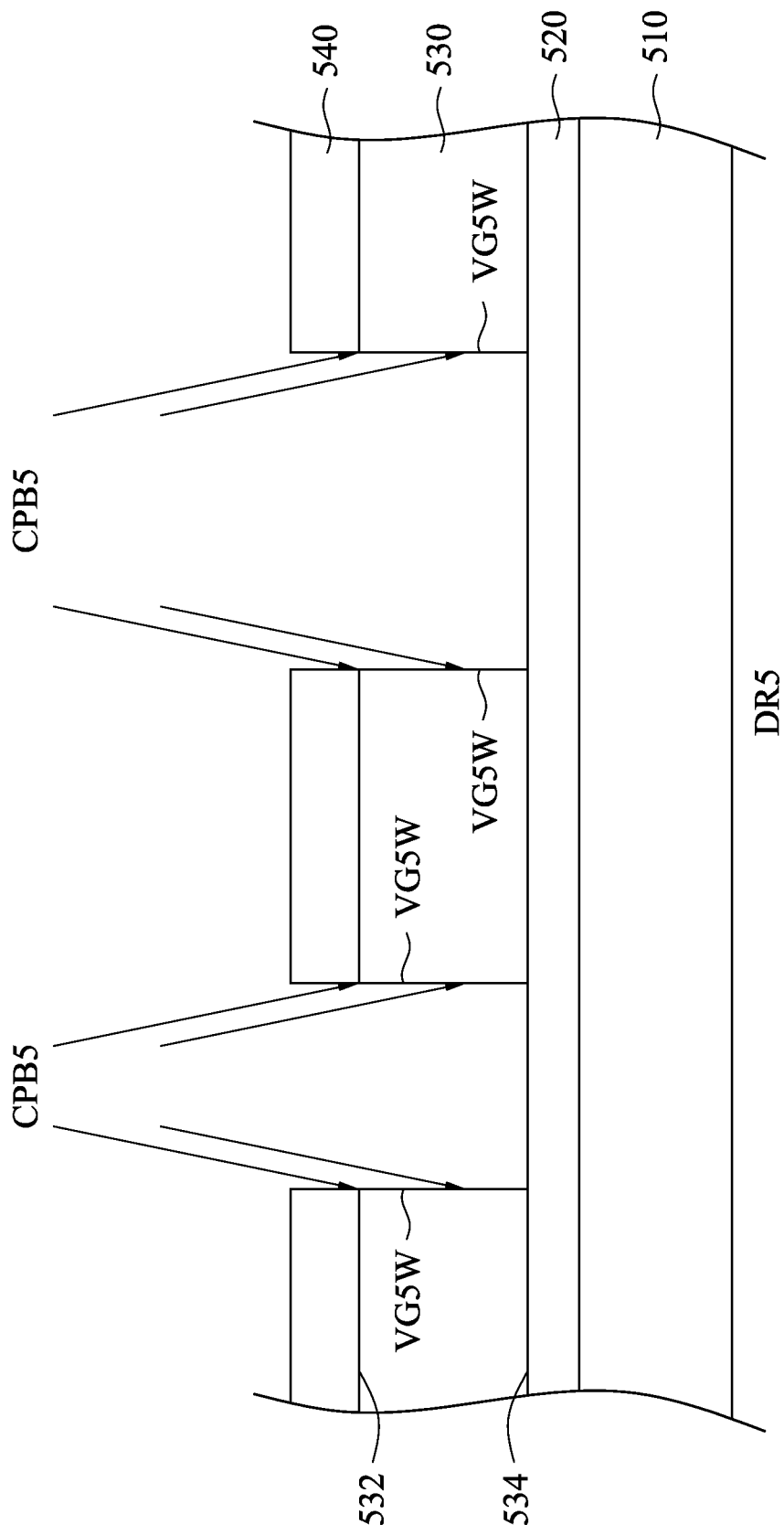

As shown in FIG. 5C, the vertical sidewalls VGSW of the vertical gaps VG5 are etched by using directional charged particle beams CPB5. In some embodiments, equipment used to etch the vertical sidewalls VGSW is similar to the equipment shown in FIG. 1. The directional charged particle beams CPB5 are similar to the directional charged particle beams CPB1, in which each of the directional charged particle beams CPB5 is provided to have two peaks as shown in FIG. 2C. In some embodiments, the two peaks correspond to two angles substantially 30 degrees and −30 degrees. In some embodiments, the two peaks correspond to two angles substantially 8 degrees and −8 degrees. In some embodiments, the two peaks correspond to two angles substantially 1.3 degrees and −1.3 degree. Further, the semiconductor device 500 can be moved along a direction DR5 when being etched by the directional charged particle beams CPB5.

Figure 5D:
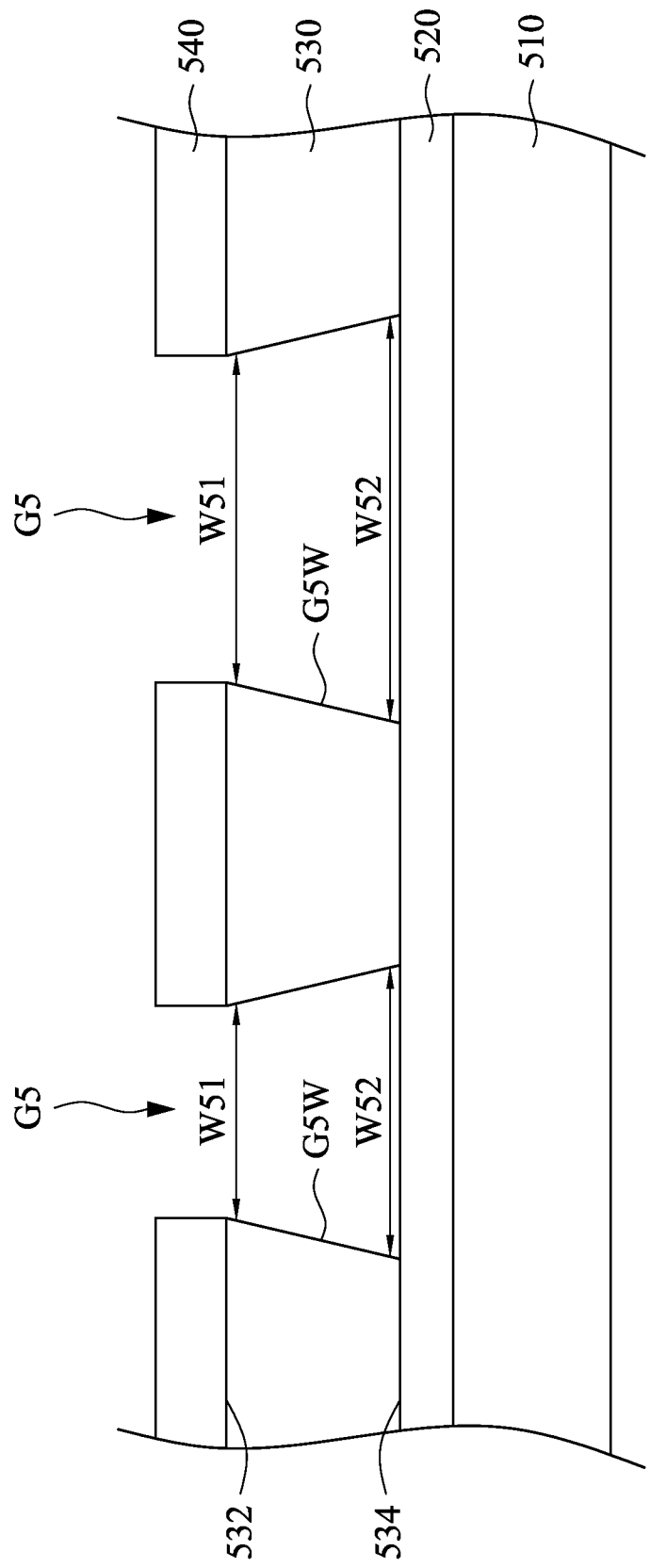

Then, after the sidewalls VG5W of the vertical gaps VG5 are etched, gaps G5 each having a re-entrance profile are formed as shown in FIG. 5D. The gap G5 having the re-entrance profile has a top portion adjacent to the top surface 532 and a bottom portion adjacent to the bottom surface 534, and the top portion of the gap G5 has a width W51 smaller than a width W52 of the bottom portion of the gap G5, because the gap G5 have inclined sidewalls G5W.

Similar to the gaps G2, the gaps G5 having the re-entrance profile also benefit formation of interconnections.

Figure 6A:
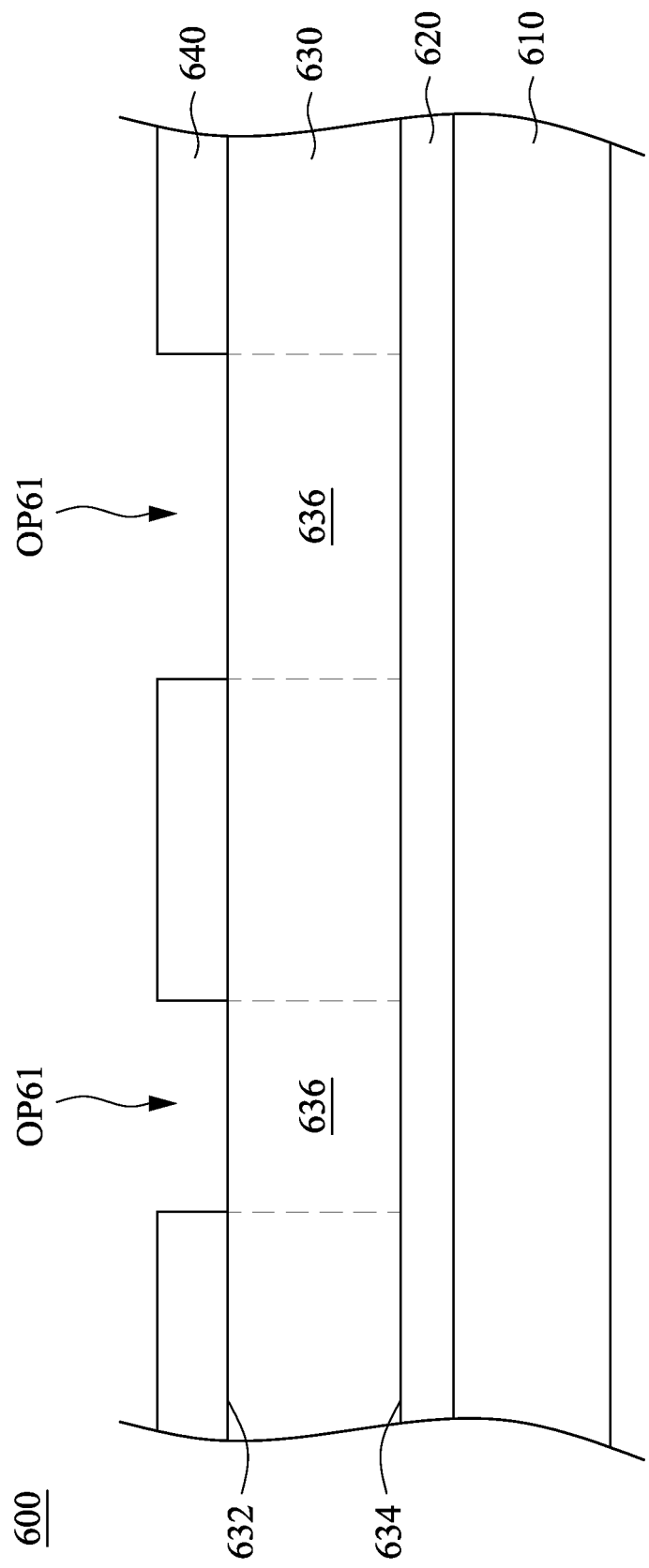
FIG. 6A to FIG. 6D are cross-sectional views of intermediate stages showing a method for forming gaps in accordance with an embodiment of the present disclosure.

Referring to FIG. 6A to FIG. 6D, FIG. 6A to FIG. 6D are cross-sectional views of intermediate stages showing a method for forming gaps in accordance with an embodiment of the present disclosure. As shown in FIG. 6A, a semiconductor device 600 to be etched is provided. The semiconductor device 600 includes a circuit layer 610, an etch stop layer 620, a material layer 630 and a mask layer 640. The circuit layer 610 may include active circuits or passive circuits. In some embodiments, the circuit layer 610 includes transistor circuits formed on a semiconductor substrate.

The etch stop layer 620 is disposed on the circuit layer 610. The etch stop layer 620 is used to protect the circuit layer 610 from being damaged by subsequent etching processes. In some embodiments, the etch stop layer 620 is formed by titanium nitride, silicon, silicon nitride, or oxide, but embodiments of the present disclosure are not limited thereto.

The material layer 630 is disposed on the etch stop layer 620. The material layer 630 is etched in the subsequent etching processes to form plural gaps for interconnection. The material layer 630 has a top surface 632 and a bottom surface 634. The top surface 632 is adjacent to the mask layer 640, and the bottom surface 634 is adjacent to the etch stop layer 620. In some embodiments, the material layer 630 is formed by silicon nitride, spin-on-carbon, or silicon oxide, but embodiments of the present disclosure are not limited thereto.

The mask layer 640 is disposed on the material layer 630. The mask layer 640 is formed to have openings OP61, thereby exposing portions 636 of the material layer 630. In some embodiments, the mask layer 640 is formed by a photoresist bottom layer, silicon oxide, or silicon nitride, but embodiments of the present disclosure are not limited thereto.

Figure 6B:
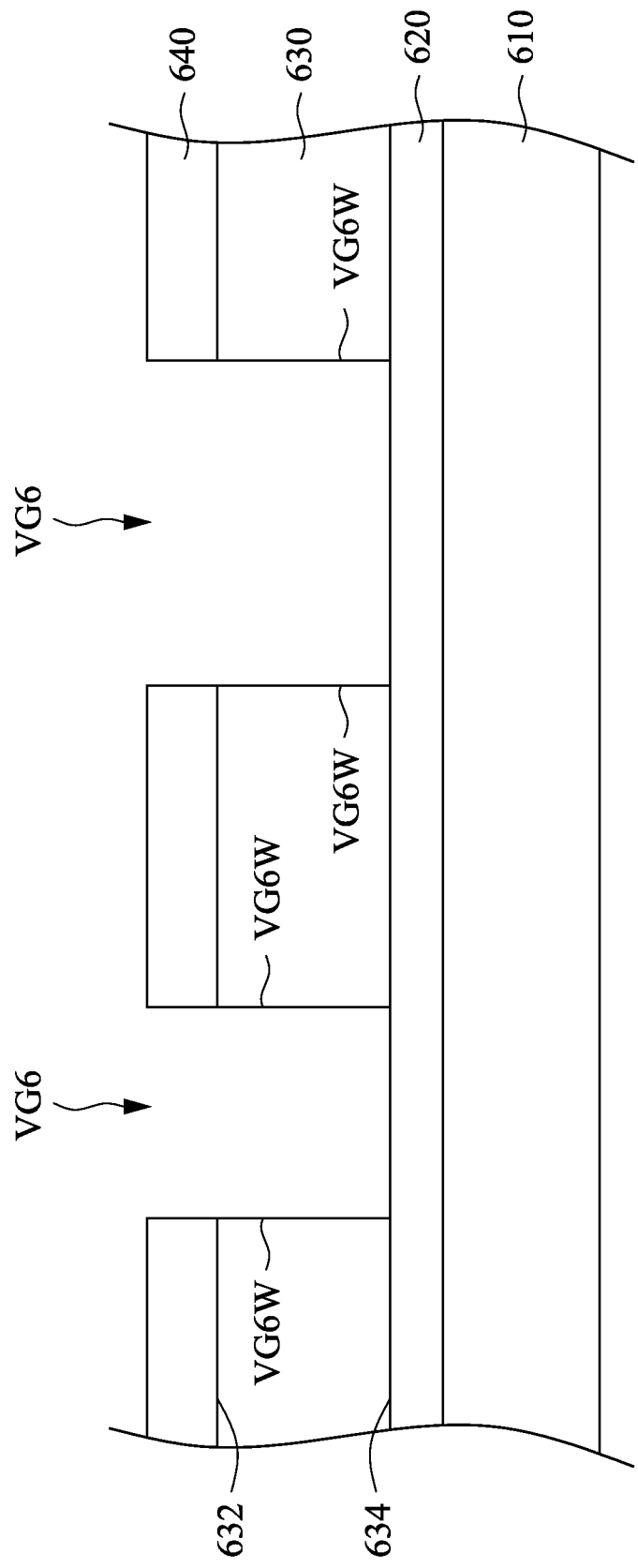

As shown in FIG. 6B, the material layer 630 is etched to form plural vertical gaps VG6 in the material layer 630. Because the exposed portions 636 of the material layer 530 are not covered by the mask layer 640, the exposed portions 636 of the material layer 630 are removed, thereby forming the vertical gaps VG6. Each of the vertical gaps VG6 has a vertical sidewall VG6W orthogonal to the top surface 632 and the bottom surface 634 of the material layer 630, and the vertical sidewalls VG6W extend from the bottom surface 634 of the material layer 630 to the top surface 632 of the material layer 630. In some embodiments, the material layer 630 is etched by using a wet etching process to form the vertical gaps VG6, but embodiments of the present invention are not limited thereto.

Figure 6C:
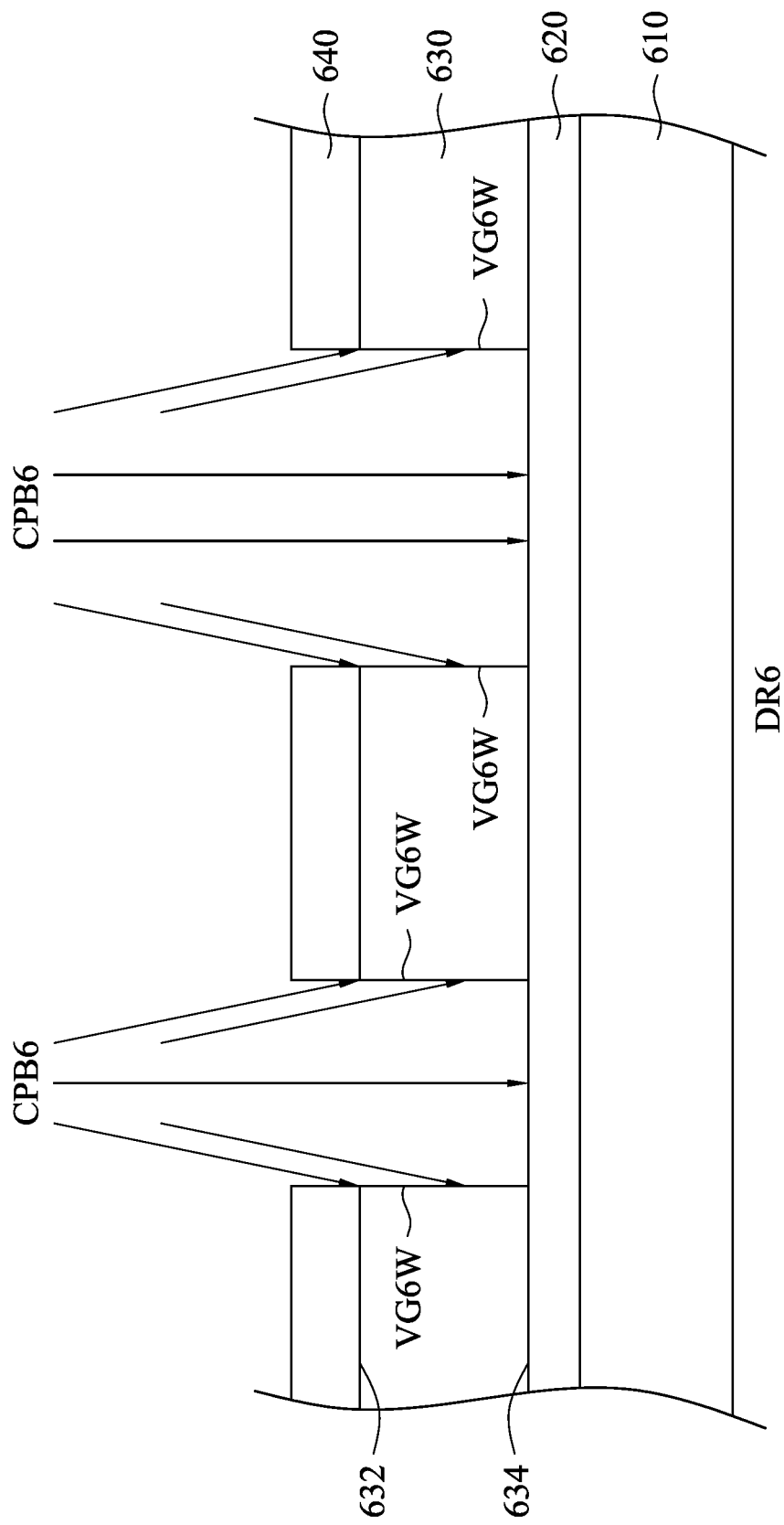

As shown in FIG. 6C, the vertical sidewalls VG6W of the vertical gaps VG6 are etched by using directional charged particle beams CPB6. In some embodiments, equipment used to etch the vertical sidewalls VG6W is similar to the equipment shown in FIG. 1. The directional charged particle beams CPB6 are similar to the directional charged particle beams CPB1, in which each of the directional charged particle beams CPB6 is provided to have a single peak as shown in FIG. 3C. In some embodiments, the single peak corresponds to a predetermined angle substantially 0 degree.

Figure 6D:
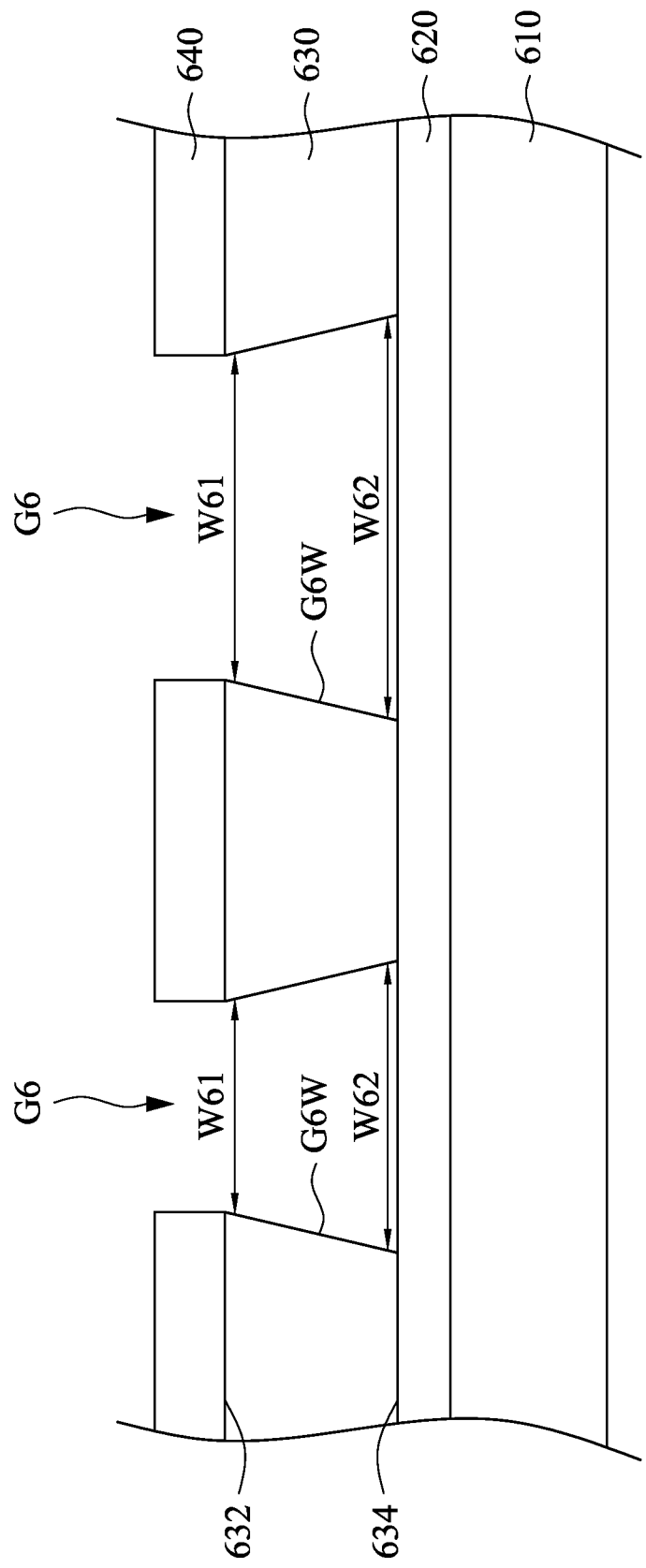

Then, after the sidewalls VG6W of the vertical gaps VG6 are etched, gaps G6 each having a re-entrance profile are formed as shown in FIG. 6D. The gap G6 having the re-entrance profile has a top portion adjacent to the top surface 632 and a bottom portion adjacent to the bottom surface 634, and the top portion of the gap G6 has a width W61 smaller than a width W62 of the bottom portion of the gap G6, because the gap G6 have inclined sidewalls G6W.

Similar to the gaps G2, the gaps G6 having the re-entrance profile also benefit formation of interconnections.

Figure 7A:
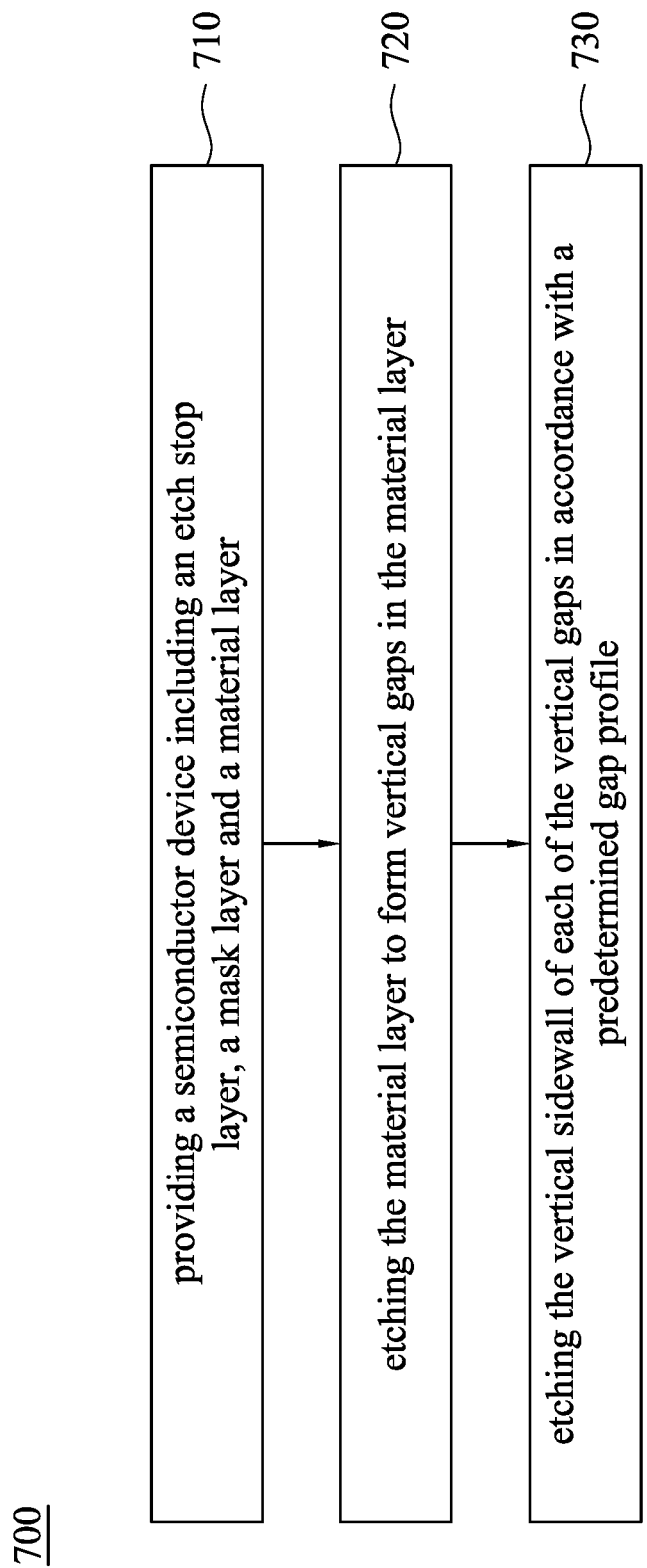
FIG. 7A is a flow chart of a method for forming gaps in a material layer in accordance with an embodiment of the present disclosure.

Referring to FIG. 7A, FIG. 7A is a flow chart of a method 700 for forming gaps in a material layer in accordance with an embodiment of the present disclosure. The method 700 begins at operation 710. In operation 710, the semiconductor device including an etch stop layer, a material layer and a mask layer is provided. For example, the semiconductor device 500 including the etch stop layer 520, the material layer 530 and the mask layer 540 is provided as shown in FIG. 5A. For another example, the semiconductor device 600 including the etch stop layer 620, the material layer 630 and the mask layer 640 is provided as shown in FIG. 6A.

Thereafter, in operation 720, a material layer is etched to remove exposed portions of the material layer to form the vertical gaps. For example, the material layer 530 is etched to remove the exposed portions 536 of the material layer 530 to form the vertical gaps VG5 as shown in FIG. 5B. For another example, the material layer 630 is etched to remove the exposed portions 636 of the material layer 630 to form the vertical gaps VG6 as shown in FIG. 6B.

Then, in operation 730, a vertical sidewall of each of the vertical gaps is etched in accordance with a predetermined gap profile to form gaps each having the re-entrance profile. For example, the vertical sidewall VGSW of each of the vertical gaps VG5 is etched in accordance with a predetermined gap profile to form the gaps G5. For another example, the vertical sidewall VG6W of each of the vertical gaps VG6 is etched in accordance with a predetermined gap profile to form the gaps G6.

Figure 7B:
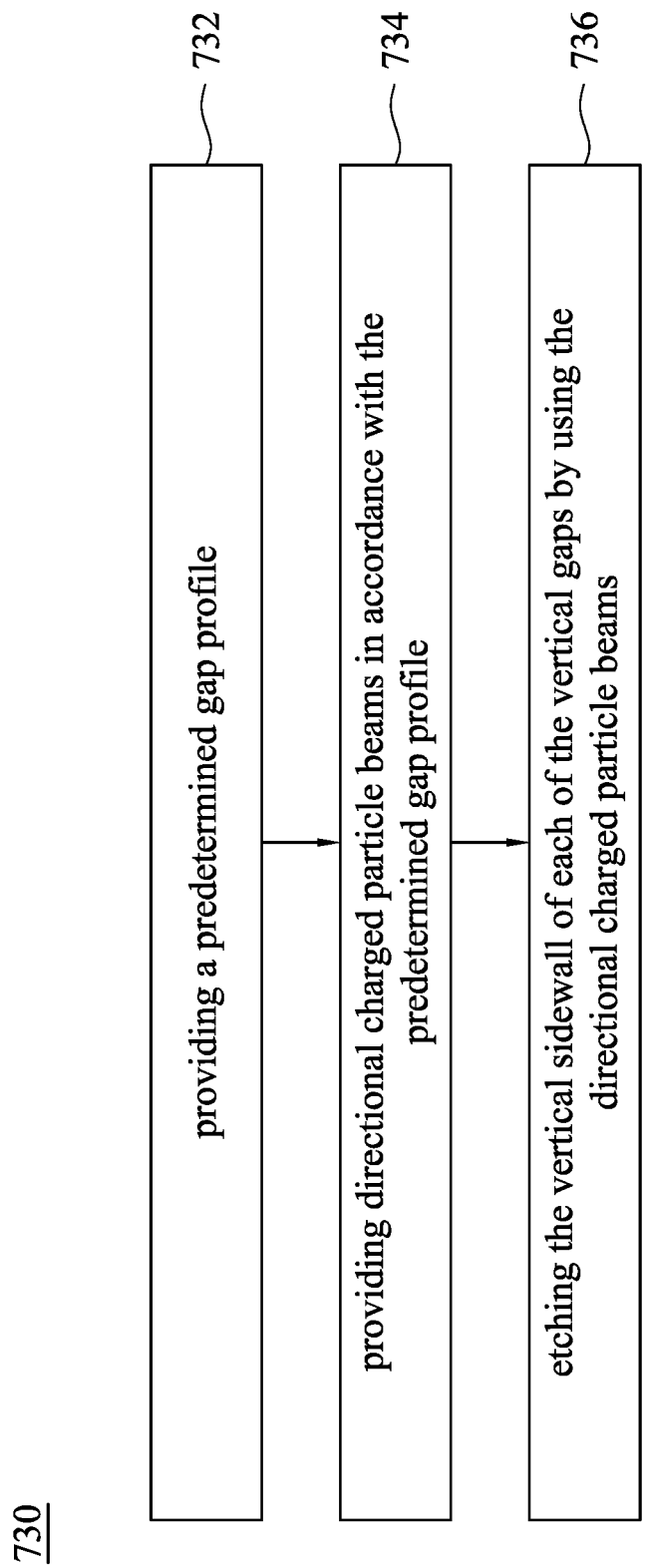
FIG. 7B is a flow chart of the operation for etching the material layer in accordance with an embodiment of the present disclosure.

Referring to FIG. 7B, FIG. 7B is a flow chart of operation 730 for etching the material layer. Operation 730 begins at operation 732. In operation 732, a predetermined gap profile is provided. In some embodiments, the predetermined gap profile is the re-entrance profile, but embodiments of the present disclosure are not limited thereto. Then, in operation 734, directional charged particle beams are provided in accordance with the predetermined gap profile. For example, the directional charged particle beams CPB5 having two peaks are provided. For another example, the directional charged particle beams CPB6 having a single peak are provided.

Further, in some embodiments, the vertical distance Z (shown in FIG. 1) between the semiconductor device and the aperture is determined in accordance with the predetermined gap profile, and the directional charged particle beams CPB5 are provided in accordance with the vertical distance Z and the predetermined gap profile. In some embodiments, the directional charged particle beams CPB5 having two peaks corresponding to two angles substantially 30 degrees and −30 degrees are provided when the vertical distance Z is substantially 15 mm. In some embodiments, the directional charged particle beams CPB5 having two peaks corresponding to two angles substantially 8 degrees and −8 degrees are provided when the vertical distance Z is substantially 8.5 mm. In some embodiments, the directional charged particle beams CPB5 having two peaks corresponding to two angles substantially 1.3 degrees and −1.3 degrees are provided when the vertical distance Z is substantially 7 mm.

Thereafter, in operation 736, the vertical sidewall of each of the vertical gaps is etched in accordance with a predetermined gap profile by using the directional charged particle beams. For example, the vertical sidewalls VGSW of the vertical gaps VG5 are etched by using the directional charged particle beams CPB5, as shown in FIG. 5C and FIG. 5D. For another example, the vertical sidewalls VG6W of the vertical gaps VG6 are etched by using the directional charged particle beams CPB6, as shown in FIG. 6C and FIG. 6D.

Figure 8A:
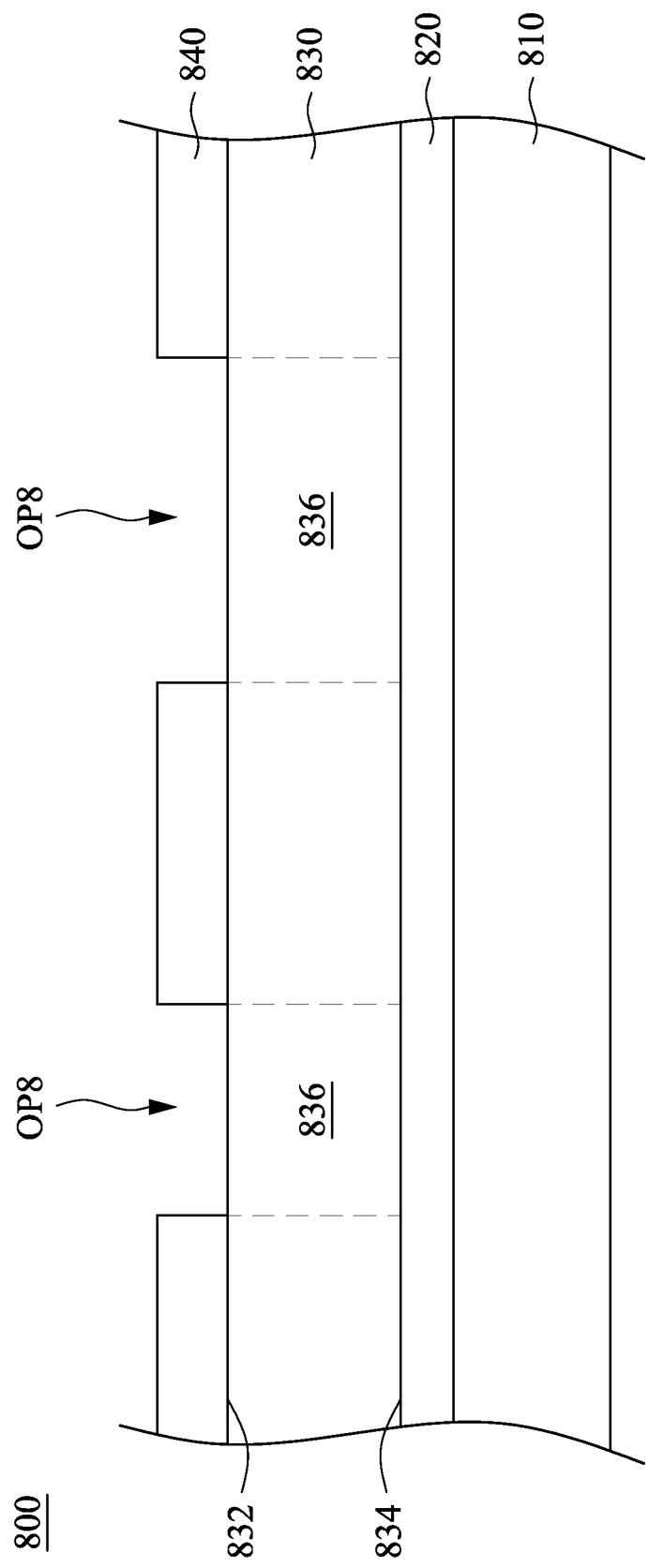

Referring to FIG. 8A to FIG. 8D, FIG. 8A to FIG. 8D are cross-sectional views of intermediate stages showing a method for forming gaps in accordance with some embodiments of the present disclosure. As shown in FIG. 8A, a semiconductor device 800 to be etched is provided. The semiconductor device 800 includes a circuit layer 810, an etch stop layer 820, a material layer 830 and a mask layer 840. The circuit layer 810 may include active circuits or passive circuits. In some embodiments, the circuit layer 810 includes transistor circuits formed on a semiconductor substrate.

The etch stop layer 820 is disposed on the circuit layer 810. The etch stop layer 820 is used to protect the circuit layer 810 from being damaged by subsequent etching processes. In some embodiments, the etch stop layer 820 is formed by titanium nitride, silicon, silicon nitride, or oxide, but embodiments of the present disclosure are not limited thereto.

The material layer 830 is disposed on the etch stop layer 820. The material layer 830 is etched in the subsequent etching processes to form plural gaps for interconnection. The material layer 830 has a top surface 832 and a bottom surface 834. The top surface 832 is adjacent to the mask layer 840, and the bottom surface 834 is adjacent to the etch stop layer 820. In some embodiments, the material layer 830 is formed by silicon nitride, spin-on-carbon, or silicon oxide, but embodiments of the present disclosure are not limited thereto.

The mask layer 840 is disposed on the material layer 830. The mask layer 840 is formed to have openings OP81, thereby exposing portions 836 of the material layer 830. In some embodiments, the mask layer 840 is formed by a photoresist bottom layer, silicon oxide, or silicon nitride, but embodiments of the present disclosure are not limited thereto.

Figure 8B:
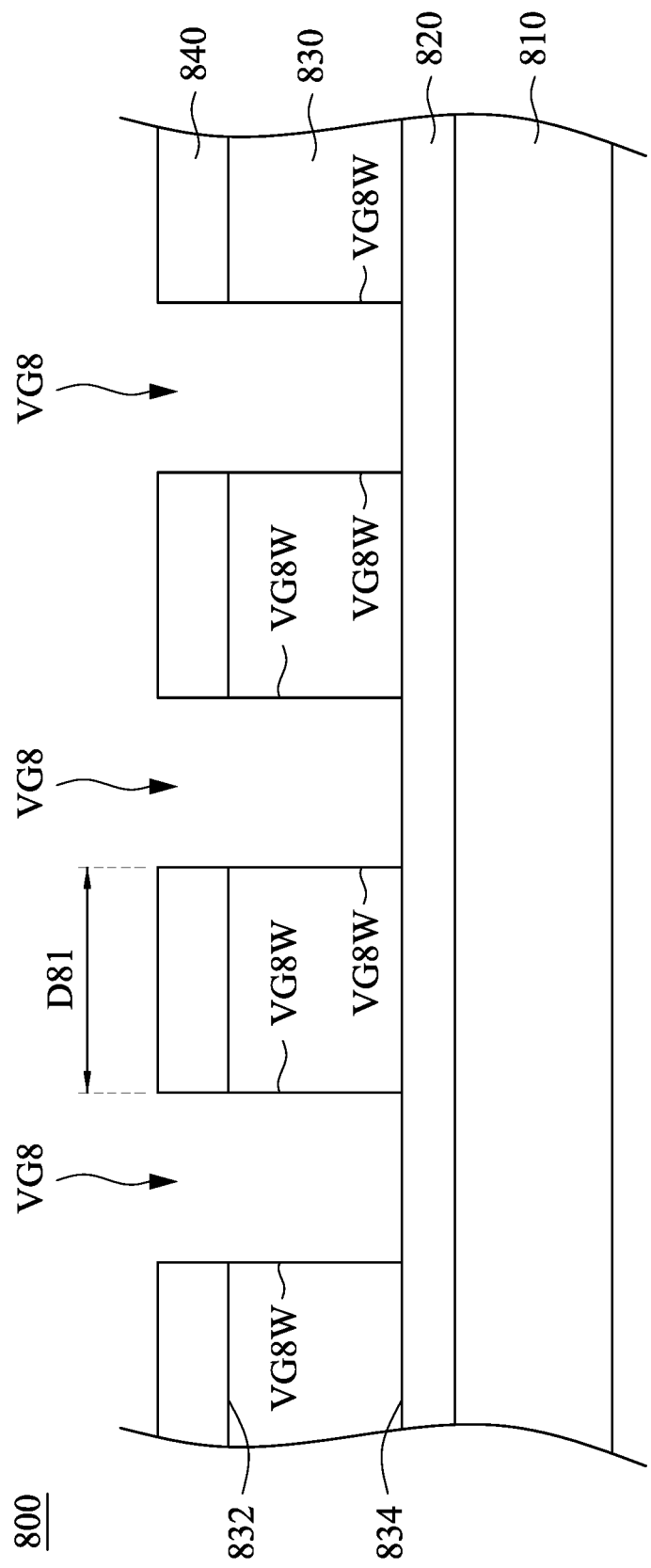
Figure 8D:
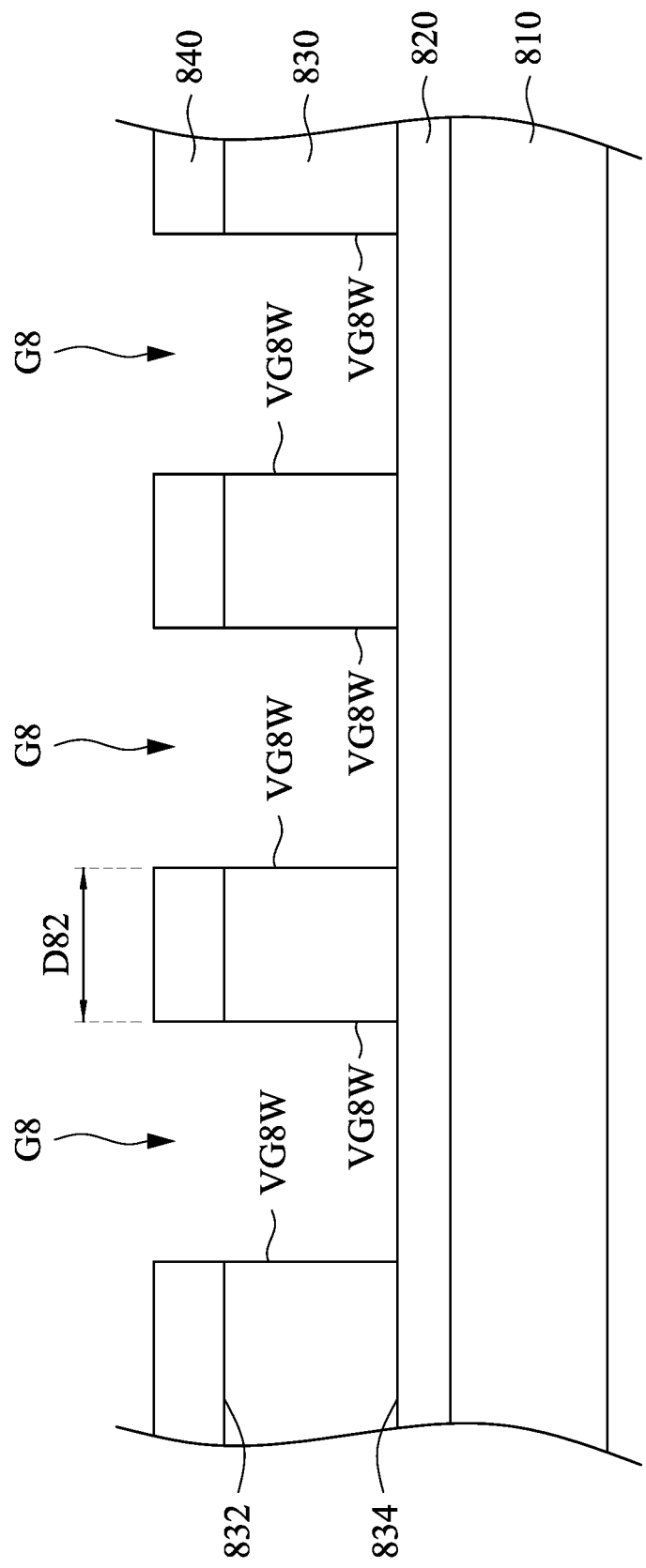

As shown in FIG. 8B, the material layer 830 is etched to form plural vertical gaps VG8 in the material layer 830. Because the exposed portions 836 of the material layer 830 are not covered by the mask layer 840, the exposed portions 836 of the material layer 830 are removed, thereby forming the vertical gaps VG8, in which there is a gap distance D81 between adjacent two of the vertical gaps VG8.

Each of the vertical gaps VG8 has a vertical sidewall VG8W orthogonal to the top surface 832 and the bottom surface 834 of the material layer 830, and the vertical sidewalls VG8W extend from the bottom surface 834 of the material layer 830 to the top surface 832 of the material layer 830. In some embodiments, the material layer 830 is etched by using a wet etching process to form the vertical gaps VG8, but embodiments of the present invention are not limited thereto.

As shown in FIG. 8C(1) and FIG. 8C(2), the vertical sidewalls VG5W of the vertical gaps VG5 are etched by using directional charged particle beams CPB81 or CPB82. In some embodiments, equipment used to etch the vertical sidewalls VG8W is similar to the equipment shown in FIG. 1. The directional charged particle beams CPB81 and CPB82 are similar to the directional charged particle beams CPB1, in which each of the directional charged particle beams CPB81 can be provided to have two peaks as shown in FIG. 8C(1), and each of the charged particle beams CPB82 can be provided to have a single peak as shown in FIG. 8C(2).

Further, the mask layer 840 is also etched by the directional charged particle beams CPB81 or CPB82 when the vertical sidewalls VG5W of the vertical gaps VG5 are etched, thereby uniformly decreasing the distance between adjacent two of the vertical gaps VG8 (maybe referred to as "end to end push").

After the etching of the directional charged particle beams CPB8, gaps G8 are formed, and there is a gap distance D82 between adjacent two of the gaps G8, in which the gap distance D82 is smaller than the gap distance D81.

Figure 9A:
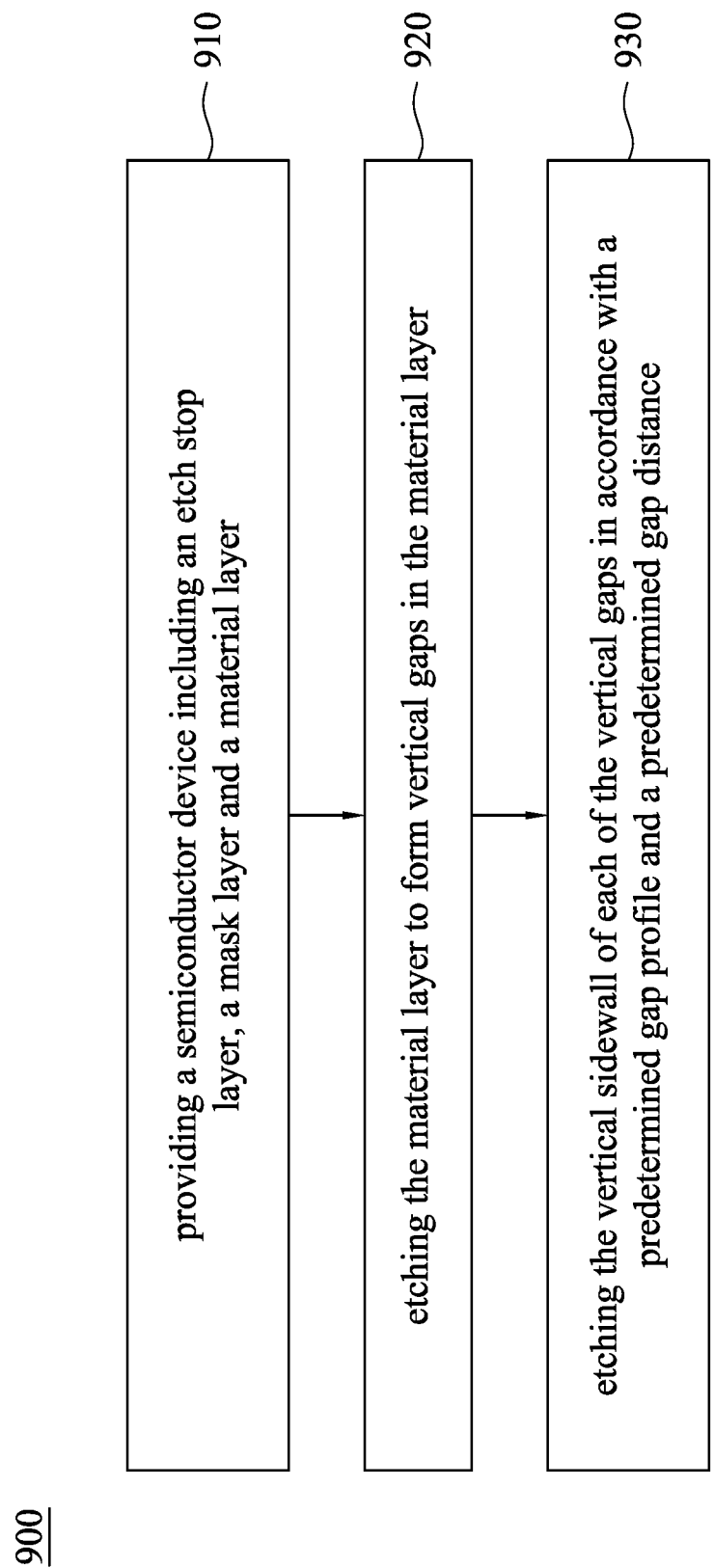
FIG. 9A is a flow chart of a method for forming gaps in a material layer in accordance with an embodiment of the present disclosure.

Referring to FIG. 9A, FIG. 9A is a flow chart of a method 900 for forming gaps in a material layer in accordance with an embodiment of the present disclosure. The method 900 begins at operation 910. In operation 910, the semiconductor device 800 including the etch stop layer 820, the material layer 830 and the mask layer 840 is provided, as shown in FIG. 8A.

Thereafter, in operation 920, the material layer 830 is etched to form the vertical gaps VG8 in the material layer 830 as shown in FIG. 8B.

Then, in operation 930, the vertical sidewall VG8W of each of the vertical gaps VG8 is etched in accordance with a predetermined gap profile and a predetermined gap distance to form the wider gaps G8.

Figure 9B:
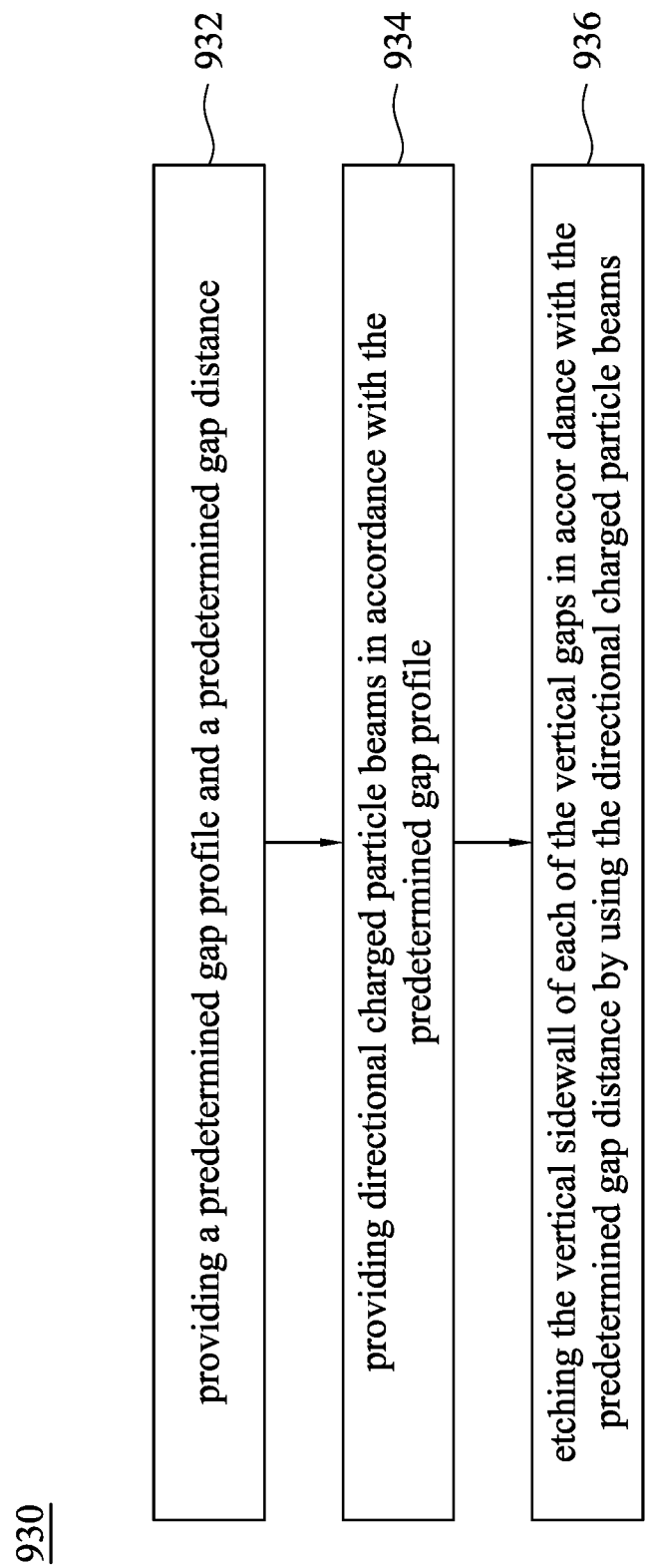
FIG. 9B is a flow chart of the operation for etching the material layer in accordance with an embodiment of the present disclosure.

Referring to FIG. 9B, FIG. 9B is a flow chart of operation 930 for etching the material layer. Operation 930 begins at operation 932. In operation 932, a predetermined gap profile and a predetermined gap distance, such as the distance D82, are provided. In some embodiments, the predetermined gap profile is a vertical gap profile, but embodiments of the present disclosure are not limited thereto. Then, in operation 934, the directional charged particle beams CPB81 or CPB82 are provided in accordance with the predetermined gap profile. For example, the directional charged particle beams CPB81 having two peaks are provided. For another example, the directional charged particle beams CPB82 having a single peak are provided.

Further, in some embodiments, the vertical distance Z (shown in FIG. 1) between the semiconductor device and the aperture is determined in accordance with the predetermined gap profile, and the directional charged particle beams CPB81 or CPB82 are provided in accordance with the vertical distance Z and the predetermined gap profile. In some embodiments, the directional charged particle beams CPB81 having two peaks corresponding to two angles substantially 30 degrees and −30 degrees are provided when the vertical distance Z is substantially 15 mm. In some embodiments, the directional charged particle beams CPB81 having two peaks corresponding to two angles substantially 8 degrees and −8 degrees are provided when the vertical distance Z is substantially 8.5 mm. In some embodiments, the directional charged particle beams CPB81 having two peaks corresponding to two angles substantially 1.3 degrees and −1.3 degrees are provided when the vertical distance Z is substantially 7 mm.

Thereafter, in operation 936, the vertical sidewall VG8W of each of the vertical gaps VG8 is etched in accordance with the distance D82 by using the directional charged particle beams CPB8.

Because, the method 900 utilizes the directional charged particle beams CPB81 or CPB82 to etch the vertical sidewall VG8W of each of the vertical gaps VG8, the distance between adjacent two of the gaps G8 can be precisely controlled.

In accordance with an embodiment of the present disclosure, the present disclosure discloses a method for forming gaps in a material layer. In the method, at first, a semiconductor device is provided. The semiconductor device includes an etch stop layer, a material layer located on the etch stop layer, and a mask layer located on the material layer. The mask layer has plural openings to expose portions of the material layer. Then, the material layer is etched to remove the exposed portions of the material layer to form plural gaps in the material layer. In the operation of etching the material layer, at first, a predetermined gap profile is provided. Then, plural directional charged particle beams are provided in accordance with the predetermined gap profile. Thereafter, the exposed portions of the material layer are etched by using the directional charged particle beams.

In some embodiments, each of the directional charged particle beams is provided to have two energy peaks.

In some embodiments, the two energy peaks are at substantially 30 degrees and −30 degrees, respectively.

In some embodiments, each of the directional charged particle beams is provided to have a single energy peak at substantially 0 degree.

In some embodiments, the semiconductor device is moved to enable all the exposed portions of the material layer to be etched when using the directional charged particle beams to etch the portions of the material layer is conducted.

In accordance with another embodiment of the present disclosure, in the method for forming gaps in a material layer, at first, a semiconductor device is provided. The semiconductor device includes an etch stop layer, a mask layer located on etch stop layer, and a material layer located between the etch stop layer and the mask layer. The material layer has a top surface adjacent to the mask layer and a bottom surface adjacent to the etch stop layer. Then, the material layer is etched to form plural vertical gaps in the material layer, in which each of the vertical gaps has a vertical sidewall orthogonal to the top surface and the bottom surface of the material layer. Thereafter, the vertical sidewall of each of the vertical gaps is etched in accordance with a predetermined gap profile.

In some embodiments, the predetermined gap profile is a re-entrance profile.

In some embodiments, the method further includes providing a predetermined gap distance between adjacent two of the gaps having the predetermined gap profile, and the etching the vertical sidewall of each of the vertical gaps is conducted in accordance with the predetermined gap distance.

In some embodiments, the operation for etching the vertical sidewall of each of the gaps includes: providing the predetermined gap profile; providing plural directional charged particle beams in accordance with the predetermined gap profile; and etching the vertical sidewall of each of the vertical gaps by using the directional charged particle beams.

In some embodiments, each of the directional charged particle beams is provided to have two energy peaks.

In some embodiments, two energy peaks are at substantially 30 degrees and −30 degrees, respectively.

In some embodiments, each of the directional charged particle beams is provided to have a single energy peak at substantially 0 degree.

In some embodiments, the operation for etching the material layer to form the vertical gaps is conducted by using a wet etching process.

In accordance with another embodiment of the present disclosure, the present disclosure provides equipment for forming gaps in a material layer. The equipment includes a supporter and an etching device. The supporter is configured to support a semiconductor device. The semiconductor device includes an etch stop layer, a material layer located on the etch stop layer, and a mask layer located on etch stop layer. The mask layer has plural openings to expose portions of the material layer. The etching device is configured to emit a plurality of directional charged particle beams to etch the exposed portions of the material layer for forming a plurality of gaps in the material layer, in which the etching device has plural ion extraction apertures to emit the directional charged particle beams. A vertical distance between the semiconductor device and the ion extraction apertures is determined in accordance with a profile of each of the gap, each of the directional charged particle beams has two energy peaks at two angles, and the angles are determined in accordance with a profile of each of the gaps and the vertical distance.

In some embodiments, the vertical distance is substantially 7 mm.

In some embodiments, the two angles are substantially 1.3 degrees and −1.3 degrees, respectively.

In some embodiments, the vertical distance is substantially 8.5 mm.

In some embodiments, the two angles are substantially 8 degrees and −8 degrees, respectively.

In some embodiments, the vertical distance is substantially 15 mm.

In some embodiments, the two angles are substantially 30 degrees and −30 degrees, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming gaps in a dielectric layer, comprising:
    providing a semiconductor device, wherein the semiconductor device comprises:
        an etch stop layer;
        a dielectric layer located on the etch stop layer; and
        a mask layer located on the etch stop layer, wherein the mask layer has a plurality of first openings to expose portions of the dielectric layer;
    etching the dielectric layer to remove the exposed portions of the dielectric layer to form a plurality of gaps in the dielectric layer, wherein etching the dielectric layer comprises: etching the exposed portions of the dielectric layer by using a plurality of directional charged particle beams directing through the first openings in the mask layer such that a width of each of the gaps in the dielectric layer increases as a distance from the etch stop layer decreases;
    forming an isolation layer to fill an entirety of the gaps;
    removing the dielectric layer to form second openings after forming the isolation layer in the gaps; and
    filling the second openings with a metal material.

2. The method of claim 1, wherein each of the directional charged particle beams is provided to have two energy peaks.

3. The method of claim 2, wherein the two energy peaks are at substantially 30 degrees and −30 degrees, respectively.

4. The method of claim 1, wherein the semiconductor device is moved to enable all the exposed portions of the dielectric layer to be etched when using the directional charged particle beams to etch the portions of the dielectric layer is conducted.

5. The method of claim 1, wherein etching the exposed portions of the dielectric layer comprises moving the semiconductor device along a direction vertical to a perpendicular of the semiconductor device.

6. The method of claim 1, wherein etching the exposed portions of the dielectric layer is performed to form the plurality of gaps in the dielectric layer, wherein a top width of each of the gaps is narrower than a bottom width of each of the gaps.

7. A method for forming gaps in a dielectric layer, comprising:
    providing a semiconductor device, wherein the semiconductor device comprises:
        an etch stop layer;
        a mask layer located on the etch stop layer; and
        a dielectric layer located between the etch stop layer and the mask layer, wherein the dielectric layer has a top surface adjacent to the mask layer and a bottom surface adjacent to the etch stop layer;
    etching the dielectric layer to form a plurality of vertical gaps in the dielectric layer, wherein each of the vertical gaps has a vertical sidewall orthogonal to the top surface and the bottom surface of the dielectric layer, and the vertical sidewall extends from the bottom surface of the dielectric layer to the top surface of the dielectric layer;
    etching the vertical sidewall of each of the vertical gaps such that the vertical gaps become trapezoid gaps, and the vertical sidewall of each of the vertical gaps becomes an inclined sidewall meeting an exposed surface of the etch stop layer at an acute angle;
    filling the trapezoid gaps with an isolation layer;
    removing the dielectric layer to form inverted-trapezoid gaps in the isolation layer; and
    filling the inverted-trapezoid gaps with a metal material.

8. The method of claim 7, wherein etching the vertical sidewall of each of the vertical gaps is performed such that the sidewall of each of the vertical gaps is inclined.

9. The method of claim 7, further comprise reducing a distance between two adjacent gaps.

10. The method of claim 7, wherein etching the vertical sidewall of each of the gaps comprises:
    providing a plurality of directional charged particle beams on the vertical sidewall of each of the vertical gaps.

11. The method of claim 10, wherein each of the directional charged particle beams is provided to have two energy peaks.

12. The method of claim 11, wherein the two energy peaks are at substantially 30 degrees and −30 degrees, respectively.

13. The method of claim 7, wherein etching the dielectric layer to form the vertical gaps is conducted by using a wet etching process.

14. The method of claim 7, wherein etching the vertical sidewall of each of the vertical gaps is performed such that the mask layer is slimmed.

15. The method of claim 7, wherein etching the vertical sidewall of each of the vertical gaps is performed to incline the sidewall of each of the vertical gaps.

16. A method for forming gaps in a dielectric layer, comprising:
    depositing a dielectric layer over a circuit layer;
    depositing a mask layer over and in direct contact with the dielectric layer, wherein the mask layer has an opening exposing a top surface of the dielectric layer;
    etching the dielectric layer through the opening of the mask layer to form a first gap extending through the dielectric layer;
    after etching the dielectric layer, performing a directional etching to the dielectric layer through the opening of the mask layer such that a sidewall of the first gap extends at an angle from an edge of the mask layer downwardly to a position directly under the mask layer;
filling an entirety of the first gap with an isolation layer;
removing the dielectric layer to form a second gap; and
filling the second gap with a metal material.

17. The method of claim 16, wherein performing the directional etching comprises providing a plurality of directional charged particle beams to the dielectric layer, wherein the directional charged particle beams have two energy peaks at opposite angles.

18. The method of claim 17, wherein performing the directional etching further comprises moving the circuit layer along a direction vertical to a perpendicular of the circuit layer.

19. The method of claim 16, wherein the directional etching is performed such that the mask layer extends beyond a bottom portion of the first gap.

20. The method of claim 16, further comprising removing a portion of the dielectric layer prior to performing the directional etching.

* * * * *